US011228299B2

(12) United States Patent
Liu et al.

(10) Patent No.: US 11,228,299 B2
(45) Date of Patent: Jan. 18, 2022

(54) PIEZOELECTRIC THIN FILM RESONATOR WITH INSERTION FILM, FILTER, AND MULTIPLEXER

(71) Applicant: TAIYO YUDEN CO., LTD., Tokyo (JP)

(72) Inventors: Jiansong Liu, Tokyo (JP); Tokihiro Nishihara, Tokyo (JP); Tsuyoshi Yokoyama, Tokyo (JP); Shinji Taniguchi, Tokyo (JP); Taisei Irieda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 814 days.

(21) Appl. No.: 15/877,070

(22) Filed: Jan. 22, 2018

(65) Prior Publication Data
US 2018/0219528 A1    Aug. 2, 2018

(30) Foreign Application Priority Data

Feb. 2, 2017 (JP) .............................. JP2017-017647
Feb. 2, 2017 (JP) .............................. JP2017-017702

(51) Int. Cl.
  *H03H 9/17* (2006.01)
  *H03H 9/02* (2006.01)
  (Continued)

(52) U.S. Cl.
  CPC .............. *H03H 9/175* (2013.01); *H03H 3/02* (2013.01); *H03H 9/02015* (2013.01);
  (Continued)

(58) Field of Classification Search
  CPC .......... H03H 9/175; H03H 3/02; H03H 9/587; H03H 9/02015; H03H 9/131; H03H 9/589; H03H 9/02118; H03H 2003/021
  (Continued)

(56) References Cited

U.S. PATENT DOCUMENTS 6,812,619 B1   11/2004  Kaitila et al.
8,664,835 B2 *  3/2014  Matsuda ................ H03H 9/174
                                                310/341
(Continued)

FOREIGN PATENT DOCUMENTS

GB    2 418 791 A    4/2006
JP   2003-505906 A   2/2003
(Continued)

OTHER PUBLICATIONS

Received STIC search report from EIC 2800 searcher Samir Patel for NPL and foreign patent search on May 21, 2020. (Year: 2020).*
(Continued)

*Primary Examiner* — Shawki S Ismail
*Assistant Examiner* — Htet Z Kyaw
(74) *Attorney, Agent, or Firm* — Chen Yoshimura LLP

(57) ABSTRACT

A piezoelectric thin film resonator includes: a substrate; a piezoelectric film located on the substrate; a lower electrode and an upper electrode facing each other across at least a part of the piezoelectric film; and an insertion film that is inserted between the lower electrode and the upper electrode, is located in an outer peripheral region within a resonance region where the lower electrode and the upper electrode face each other across the piezoelectric film, is located in a region that is located outside the resonance region and surrounds the resonance region, is not located in a center region of the resonance region, and includes a first part, which is located in the resonance region and has a first film thickness, and a second part, which is located outside the resonance region and has a second film thickness, the first film thickness being less than the second film thickness.

9 Claims, 27 Drawing Sheets

(51) Int. Cl.
*H03H 9/13* (2006.01)
*H03H 9/58* (2006.01)
*H03H 3/02* (2006.01)

(52) U.S. Cl.
CPC ........ *H03H 9/02118* (2013.01); *H03H 9/131* (2013.01); *H03H 9/587* (2013.01); *H03H 9/589* (2013.01); *H03H 2003/021* (2013.01)

(58) Field of Classification Search
USPC ......................................................... 310/365
See application file for complete search history.

(56) References Cited

U.S. PATENT DOCUMENTS

| | | | | |
|---|---|---|---|---|
| 8,975,802 | B2* | 3/2015 | Matsuda | H03H 9/02834 310/313 R |
| 9,048,812 | B2 | 6/2015 | Burak et al. | |
| 10,432,166 | B2* | 10/2019 | Liu | H03H 9/02118 |
| 10,720,900 | B2* | 7/2020 | Lee | H03H 3/0077 |
| 2012/0200199 | A1 | 8/2012 | Taniguchi et al. | |
| 2012/0200373 | A1* | 8/2012 | Taniguchi | H03H 9/02157 333/189 |
| 2012/0299664 | A1* | 11/2012 | Hara | H03H 9/02118 333/133 |
| 2013/0278356 | A1* | 10/2013 | Meltaus | H03H 9/568 333/187 |
| 2014/0191826 | A1* | 7/2014 | Hashimoto | H03H 9/582 333/189 |
| 2014/0210570 | A1* | 7/2014 | Nishihara | H03H 9/175 333/133 |
| 2015/0130559 | A1* | 5/2015 | Yokoyama | H03H 9/173 333/133 |
| 2015/0130560 | A1* | 5/2015 | Yokoyama | H03H 9/706 333/133 |
| 2015/0171826 | A1* | 6/2015 | Sakashita | H03H 9/173 333/133 |
| 2015/0207490 | A1* | 7/2015 | Taniguchi | H03H 9/568 333/133 |
| 2015/0295697 | A1* | 10/2015 | Kawachi | H03H 9/706 370/276 |
| 2016/0028371 | A1* | 1/2016 | Nishihara | H03H 9/175 333/133 |
| 2016/0126930 | A1* | 5/2016 | Zou | H01L 41/047 333/187 |
| 2016/0353221 | A1* | 12/2016 | Okamura | H04R 17/005 |
| 2017/0033769 | A1* | 2/2017 | Yokoyama | H03H 9/175 |
| 2018/0013401 | A1* | 1/2018 | Lee | H03H 9/173 |

FOREIGN PATENT DOCUMENTS

| | | |
|---|---|---|
| JP | 2006-109472 A | 4/2006 |
| JP | 2011-091639 A | 5/2011 |
| JP | 2014-161001 A | 9/2014 |
| JP | 2015-139167 A | 7/2015 |

OTHER PUBLICATIONS

Japanese Office Action dated Jan. 15, 2019, in a counterpart Japanese patent application No. 2017-017702. (A machine translation (not reviewed for accuracy) attached.).

* cited by examiner

FIG. 20

|  |  | Q-VALUE AT ANTIRESONANT FREQUENCY | $K^2$ |
|---|---|---|---|
| SECOND EXAMPLE | | 2449 | 7.3% |
| THIRD EXAMPLE | | 2456 | 7.06% |
| FIRST EXAMPLE d1 [nm] | 200 | 2694 | 7.3% |
| | 205 | 2454 | 7.3% |
| | 210 | 2522 | 7.3% |

FIG. 26B FIRST MODE

FIG. 26C SECOND MODE

FIG. 26D THIRD MODE

FIG. 26E FOURTH MODE

FIG. 27B FIRST MODE

FIG. 27C SECOND MODE

FIG. 27D THIRD MODE

FIG. 27E FOURTH MODE

PIEZOELECTRIC THIN FILM RESONATOR WITH INSERTION FILM, FILTER, AND MULTIPLEXER

CROSS-REFERENCE TO RELATED APPLICATION

This application is based upon and claims the benefit of priority of the prior Japanese Patent Application No. 2017-017647, filed on Feb. 2, 2017, and the prior Japanese Patent Application No. 2017-017702, filed on Feb. 2, 2017, the entire contents of which are incorporated herein by reference.

Field

A certain aspect of the present invention relates to a piezoelectric thin film resonator, a filter, and a multiplexer.

Background

Acoustic wave devices including piezoelectric thin film resonators are used as filters and multiplexers for wireless devices such as, for example, mobile phones. The piezoelectric thin film resonator has a multilayered film in which a lower electrode and an upper electrode face each other across a piezoelectric film. The region where the lower electrode and the upper electrode face each other across the piezoelectric film is a resonance region.

Rapid diffusion of wireless systems promotes use of many frequency bands. As a result, filters and duplexers with steep skirt characteristics have been desired. One way of steepening the skirt characteristic is to increase the Q-value of the piezoelectric thin film resonator.

Japanese Patent Application Publication No. 2006-109472 (Patent Document 1) discloses a piezoelectric thin film resonator including an annulus on a surface of one of the upper electrode and the lower electrode. Japanese Patent Application Publication No. 2014-161001 (Patent Document 2) discloses a piezoelectric thin film resonator including an insertion film inserted in the piezoelectric film in the outer peripheral region of the resonance region. U.S. Pat. No. 9,048,812 (Patent Document 3) discloses a piezoelectric thin film resonator including an annulus called a bridge in the piezoelectric film.

SUMMARY OF THE INVENTION

According to a first aspect of the present invention, there is provided a piezoelectric thin film resonator including: a substrate; a piezoelectric film located on the substrate; a lower electrode and an upper electrode facing each other across at least a part of the piezoelectric film; and an insertion film that is inserted between the lower electrode and the upper electrode, is located in an outer peripheral region within a resonance region where the lower electrode and the upper electrode face each other across the piezoelectric film, is located in a region that is located outside the resonance region and surrounds the resonance region, is not located in a center region of the resonance region, and includes a first part, which is located in the resonance region and has a first film thickness, and a second part, which is located outside the resonance region and has a second film thickness, the first film thickness being less than the second film thickness.

According to a second aspect of the present invention, there is provided a filter including the above piezoelectric thin film resonator.

According to a third aspect of the present invention, there is provided a multiplexer including the above filter.

BRIEF DESCRIPTION OF THE DRAWINGS

FIG. 20 presents a Q-value at an antiresonant frequency and an electromechanical coupling coefficient in the second example, the third example, and the first example;

DETAILED DESCRIPTION

The techniques disclosed in Patent Documents 1 through 3 reduce the leak of the acoustic wave energy from the resonance region, and thereby increase the Q-value. However, the leak of the acoustic wave energy from the resonance region is not sufficiently reduced.

Hereinafter, embodiments of the present invention will be described with reference to the accompanying drawings.

First Embodiment

Figure 1A:
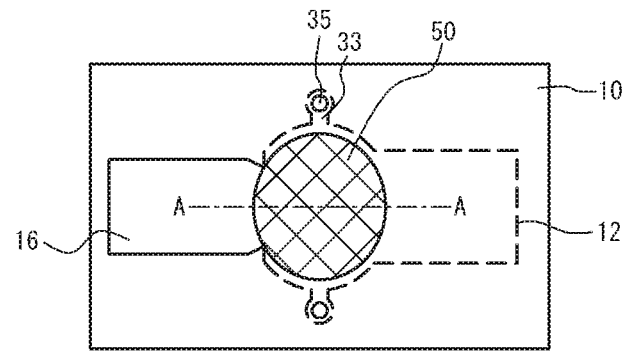
FIG. 1A is a plan view of a piezoelectric thin film resonator in accordance with a first embodiment.
Figure 1B:
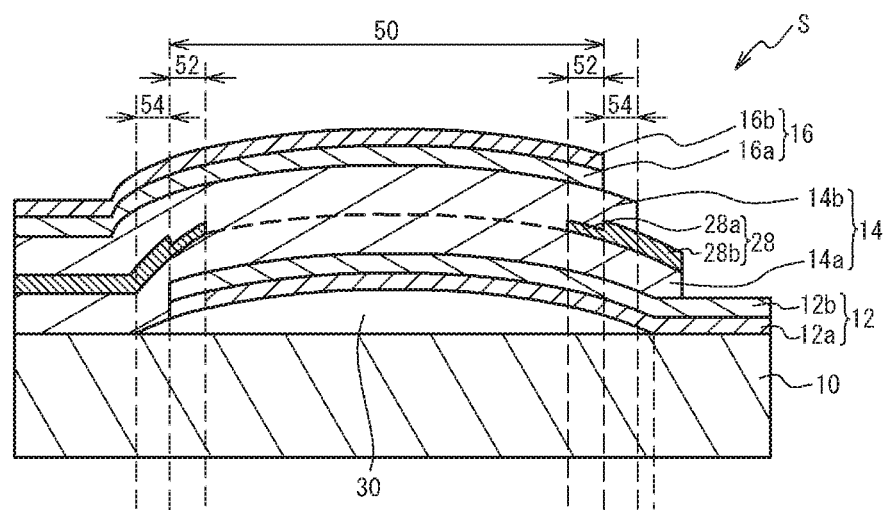
FIG. 1B and FIG. 1C are cross-sectional views taken along line A-A in FIG. 1A.
Figure 1C:
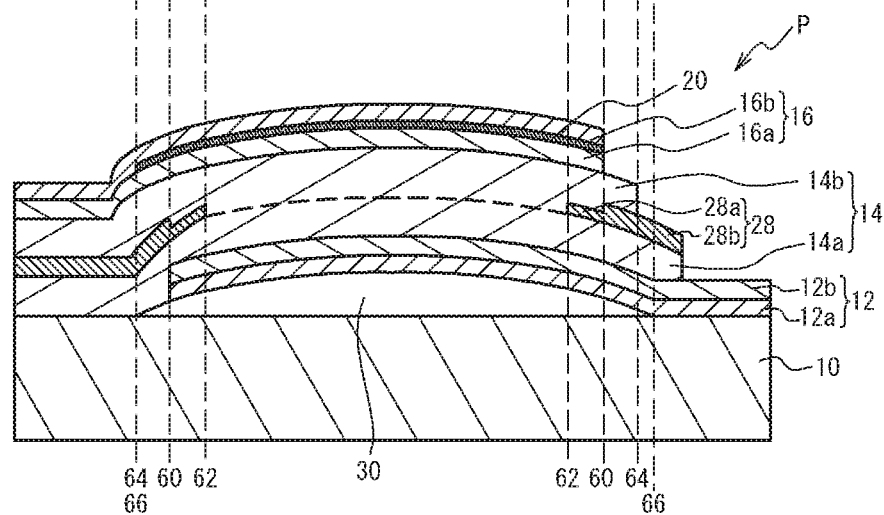

FIG. 1A is a plan view of a piezoelectric thin film resonator in accordance with a first embodiment, and FIG. 1B and FIG. 1C are cross-sectional views taken along line A-A in FIG. 1A. FIG. 1B illustrates, for example, a series resonator of a ladder-type filter, and FIG. 1C illustrates, for example, a parallel resonator of the ladder-type filter.

The structure of a series resonator S will be described with reference to FIG. 1A and FIG. 1B. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30 and increases at closer distances to the center of the air gap 30, for example. The lower electrode 12 includes a lower layer 12a and an upper layer 12b. The lower layer 12a is, for example, a chrome (Cr) film, and the upper layer 12b is, for example, a ruthenium (Ru) film.

Located on the lower electrode 12 is a piezoelectric film 14 mainly composed of aluminum nitride (AlN) having the main axis in the (002) direction. The piezoelectric film 14 includes a lower piezoelectric film 14a and an upper piezoelectric film 14b. An insertion film 28 is located between the lower piezoelectric film 14a and the upper piezoelectric film 14b.

An upper electrode 16 is located on the piezoelectric film 14 so as to have a region (a resonance region 50) in which the upper electrode 16 faces the lower electrode 12 across the piezoelectric film 14. The resonance region 50 is a region having an elliptical shape, and in which the acoustic wave in the thickness extension mode resonates. The upper electrode 16 includes a lower layer 16a and an upper layer 16b. The lower layer 16a is, for example, a Ru film, and the upper layer 16b is, for example, a Cr film.

The insertion film 28 is located in regions 52 and 54, but is not located in the center region of the resonance region 50. The region 52 corresponds to at least a part of the outer peripheral region of the resonance region 50. The region 54 is located further out than the resonance region 50. The region 52 is a region that overlaps with the air gap 30 in plan view and in which a thin insertion film 28a is inserted in the piezoelectric film 14. The region 54 is a region that overlaps with the air gap 30 in plan view and in which a thick insertion film 28b is inserted in the piezoelectric film 14.

A frequency adjusting film and/or a passivation film such as a silicon oxide film may be formed on the upper electrode 16. The multilayered film within the resonance region 50 includes the lower electrode 12, the piezoelectric film 14, and the upper electrode 16.

As illustrated in FIG. 1A, an introduction path 33 for etching a sacrifice layer is formed in the lower electrode 12. The sacrifice layer is a layer for forming the air gap 30. The vicinities of the tips of the introduction path 33 are not covered with the piezoelectric film 14, and the lower electrode 12 has holes 35 at the ends of the introduction path 33.

With reference to FIG. 1C, the structure of a parallel resonator P will be described. The parallel resonator P differs from the series resonator S in that a mass load film 20 made of a titanium (Ti) layer is located between the lower layer 16a and the upper layer 16b of the upper electrode 16. Accordingly, the multilayered film includes the mass load film 20 formed across the entire surface within the resonance region 50 in addition to the multilayered film of the series resonator S. The difference in resonant frequency between the series resonator S and the parallel resonator P is adjusted with use of the film thickness of the mass load film 20. Other structures are the same as those of the series resonator S in FIG. 1B, and the description thereof is thus omitted.

The piezoelectric thin film resonator having a resonant frequency of 2 GHz is configured as follows. The lower layer 12a of the lower electrode 12 is a Cr film with a film thickness of 100 nm, and the upper layer 12b is a Ru film with a film thickness of 200 nm. The piezoelectric film 14 is an AlN film with a film thickness of 1200 nm. The insertion films 28a and 28b are respectively silicon oxide ($SiO_2$) films with film thicknesses of 150 nm and 300 nm. The insertion film 28 is located in the middle in the film thickness direction of the piezoelectric film 14. The lower layer 16a of the upper electrode 16 is a Ru film with a film thickness of 230 nm, and the upper layer 16b is a Cr film with a film thickness of 50 nm. The frequency adjusting film is a silicon oxide film with a film thickness of 50 nm. The mass load film 20 is a Ti film with a film thickness of 120 nm. The film thickness of each layer can be appropriately set so as to achieve desired resonance characteristics.

As described in Patent Document 2, the Young's modulus of the insertion film 28 is preferably less than that of the piezoelectric film 14. When the densities are approximately the same, the Young's modulus correlates with the acoustic impedance. Thus, the acoustic impedance of the insertion film 28 is preferably less than that of the piezoelectric film 14. This configuration improves the Q-value. Furthermore, to make the acoustic impedance of the insertion film 28 less than that of the piezoelectric film 14, the insertion film 28 is preferably an aluminum (Al) film, a gold (Au) film, a copper (Cu) film, a Ti film, a platinum (Pt) film, a tantalum (Ta) film, a Cr film, or a silicon oxide film when the piezoelectric film 14 is mainly composed of aluminum nitride. Especially from the viewpoint of Young's modulus, the insertion film 28 is preferably an Al film or a silicon oxide film.

The substrate 10 may be a sapphire substrate, an alumina substrate, a spinel substrate, a quartz substrate, a glass substrate, a ceramic substrate, or a GaAs substrate instead of a Si substrate. The lower electrode 12 and the upper electrode 16 may be formed of a single-layer film of Al, Ti, Cu, molybdenum (Mo), tungsten (W), Ta, Pt, rhodium (Rh), or iridium (Ir) or a multilayered film of at least two of them instead of Ru and Cr. For example, the lower layer 16a of the upper electrode 16 may be made of Ru, and the upper layer 16b may be made of Mo.

The piezoelectric film 14 may be made of zinc oxide (ZnO), lead zirconate titanate (PZT), or lead titanate (Pb-TiO$_3$) instead of aluminum nitride. Alternatively, for example, the piezoelectric film 14 may be mainly composed of aluminum nitride, and contain other elements for improving the resonance characteristic or the piezoelectricity. For example, the use of scandium (Sc), a Group II element and a Group IV element, or a Group II element and a Group V element as additive elements improves the piezoelectricity of the piezoelectric film 14. Accordingly, the effective electromechanical coupling coefficient of the piezoelectric thin film resonator is improved. The Group II element is, for example, calcium (Ca), magnesium (Mg), strontium (Sr), or zinc (Zn). The Group IV element is, for example, Ti, zirconium (Zr), or hafnium (Hf). The Group V element is, for example, Ta, niobium (Nb), or vanadium (V). Alternatively, the piezoelectric film 14 may be mainly composed of aluminum nitride, and contain boron (B).

The frequency adjusting film may be a silicon nitride film or an aluminum nitride instead of a silicon oxide film. The mass load film 20 may be a single-layer film of Ru, Cr, Al, Cu, Mo, W, Ta, Pt, Rh, or Ir instead of Ti. For example, an insulating film made of metal nitride such as silicon nitride or metal oxide such as silicon oxide may be used. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers (the lower layer 16a and the upper layer 16b) of the upper electrode 16. The mass load film 20 may be larger than the resonance region 50 as long as the mass load film 20 includes the resonance region 50.

Figure 2:
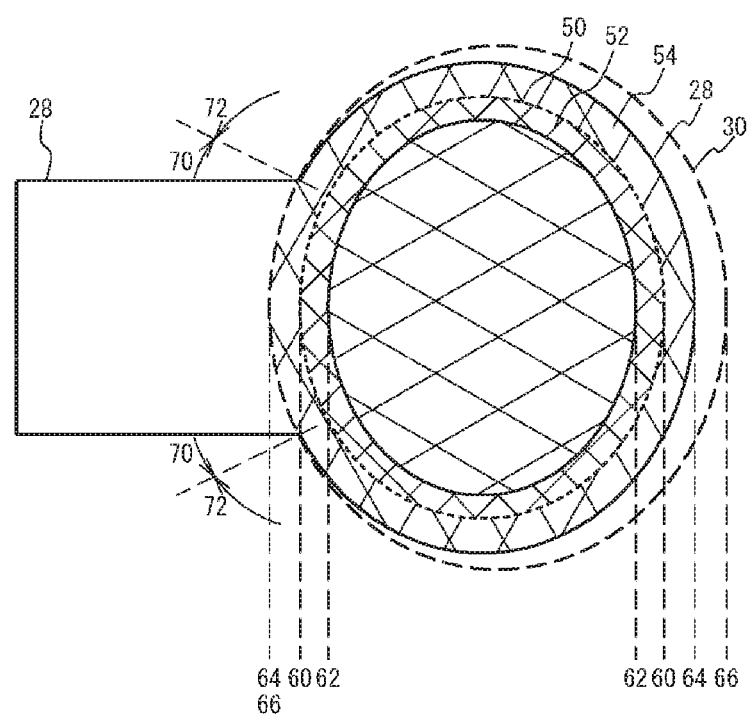
FIG. 2 is a plan view illustrating a positional relation among a resonance region, an insertion film, and an air gap around the resonance region of the piezoelectric thin film resonator of the first embodiment.

FIG. 2 is a plan view illustrating a positional relation among the resonance region, the insertion film, and the air gap around the resonance region of the piezoelectric thin film resonator of the first embodiment. For easy understanding, the ratio of the length in FIG. 2 does not necessarily correspond to those in FIG. 1A through FIG. 1C.

FIG. 1B through FIG. 2 illustrate an outer outline 60, which is the outer outline of the resonance region 50, an inner outline 62 of the region 52, which is the outer peripheral region of the resonance region 50 and in which the thin insertion film 28a is inserted in the piezoelectric film 14, an outer outline 64 of the region 54, which overlaps with the air gap 30 and in which the thick insertion film 28b is inserted in the piezoelectric film 14, and an outer outline 66 of the air gap 30. In the region surrounding the resonance region 50, illustrated are an extraction region 70 in which the upper electrode 16 is extracted from the resonance region 50 and a region 72 other than the extraction region 70 of the region surrounding the resonance region 50.

In each film, when the edge surface inclines or curves in the film thickness direction, the outer outline is the outermost of the inclined or curved edge surface, and the inner outline is the innermost of the inclined or curved edge surface. The expression "one thing is substantially aligned with another thing" means "one thing is aligned with another thing to the extent of, for example, the variability in the fabrication process or the alignment accuracy in the fabrication process.

In the extraction region 70, the outer outline of the lower electrode 12 corresponds to the outer outline 60 of the resonance region 50. In the region 72, the outer outline of the upper electrode 16 corresponds to the outer outline 60 of the resonance region 50.

In the extraction region 70, the thick insertion film 28b is located under the upper electrode 16. Since the region 54 overlaps with the air gap 30, the outer outline 64 of the region 54 is substantially aligned with the outer outline 66 of the air gap 30. In the region 72, the outer outline 66 of the air gap 30 is located further out than the outer outline 64 of the region 54. In the extraction region 70 and the region 72, the outer outline of the region 52 is substantially aligned with the outer outline 60 of the resonance region 50. The region 54 is located further out than the region 52 and is in contact with the region 52. The regions 52 and 54 are located in a ring-shape. The width of the region 52 is substantially uniform, and the width of the region 54 is substantially uniform.

Figure 3A:
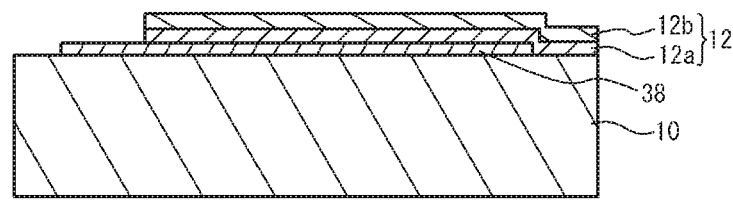
FIG. 3A through FIG. 3D are cross-sectional views (No. 1) illustrating a method of fabricating a series resonator of the first embodiment.

FIG. 3A through FIG. 4C are cross-sectional views illustrating a method of fabricating the series resonator of the first embodiment. As illustrated in FIG. 3A, a sacrifice layer 38 for forming the air gap is formed on the substrate 10 having a flat principal surface. The sacrifice layer 38 has a film thickness of, for example, 10 to 100 nm, and made of a material selected from materials such as magnesium oxide (MgO), ZnO, germanium (Ge), or silicon oxide (SiO$_2$), which easily dissolve into an etching liquid or an etching gas. Then, the sacrifice layer 38 is patterned into a desired shape by photolithography and etching. The shape of the sacrifice layer 38 corresponds to the planer shape of the air gap 30, and includes, for example, a region to become the resonance region 50. Then, the lower layer 12a and the upper layer 12b as the lower electrode 12 are formed on the sacrifice layer 38 and the substrate 10. The sacrifice layer 38 and the lower electrode 12 are formed by, for example, sputtering, vacuum evaporation, or Chemical Vapor Deposition (CVD). Then, the lower electrode 12 is patterned into a desired shape by photolithography and etching. The lower electrode 12 may be formed by liftoff.

Figure 3B:
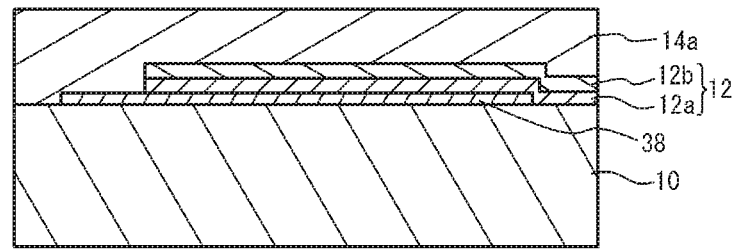
Figure 3C:
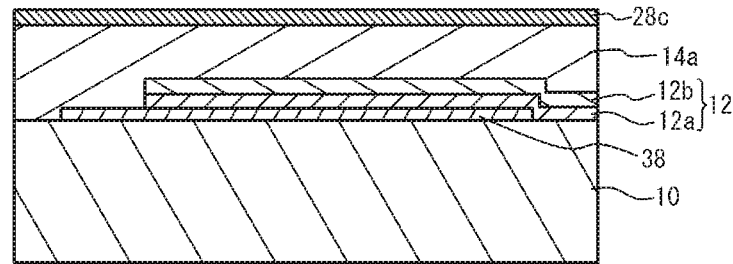
Figure 3D:
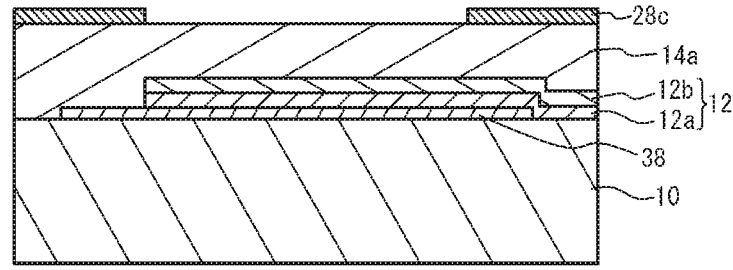

As illustrated in FIG. 3B, the lower piezoelectric film 14a is formed on the lower electrode 12 and the substrate 10 by, for example, sputtering, vacuum evaporation, or CVD. As illustrated in FIG. 3C, an insertion film 28c is formed on the lower piezoelectric film 14a by, for example, sputtering, vacuum evaporation, or CVD. As illustrated in FIG. 3D, the insertion film 28c is patterned into a desired shape by photolithography and etching. The insertion film 28c may be formed by liftoff.

Figure 4A:
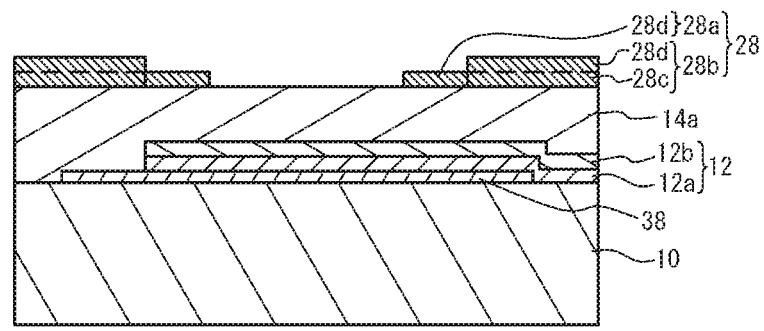
FIG. 4A through FIG. 4C are cross-sectional views (No. 2) illustrating the method of fabricating the series resonator of the first embodiment.

As illustrated in FIG. 4A, an insertion film 28d is formed on the lower piezoelectric film 14a and the insertion film 28c by, for example, sputtering, vacuum evaporation, or CVD. The insertion film 28d is patterned into a desired shape by photolithography and etching. The insertion film 28d may be formed by liftoff. Accordingly, the insertion film 28d forms the thin insertion film 28a, and the insertion films 28c and 28d form the thick insertion film 28b. The insertion films 28a and 28b form the insertion film 28.

Figure 4B:
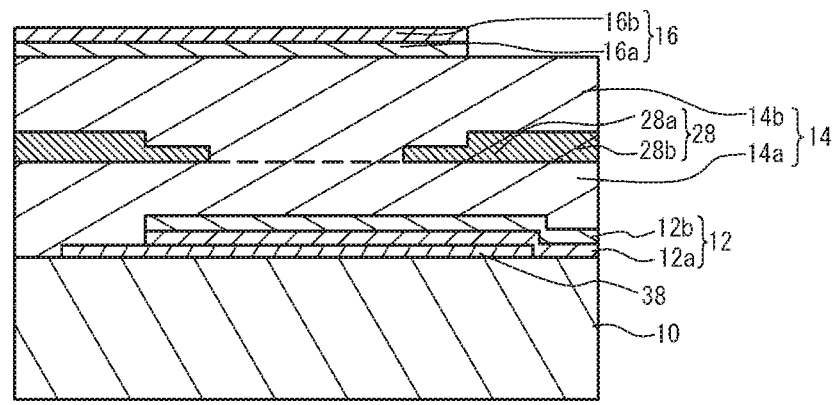

As illustrated in FIG. 4B, the upper piezoelectric film 14b and the lower layer 16a and the upper layer 16b of the upper electrode 16 are formed on the lower piezoelectric film 14a and the insertion film 28 by, for example, sputtering, vacuum evaporation, or CVD. The lower piezoelectric film 14a and the upper piezoelectric film 14b form the piezoelectric film 14. The upper electrode 16 is patterned into a desired shape by photolithography and etching. The upper electrode 16 may be formed by liftoff.

For the parallel resonator illustrated in FIG. 1C, the mass load film 20 is formed by, for example, sputtering, vacuum evaporation, or CVD after the lower layer 16a of the upper electrode 16 is formed. The mass load film 20 is patterned into a desired shape by photolithography and etching. Then, the upper layer 16b of the upper electrode 16 is formed.

Figure 4C:
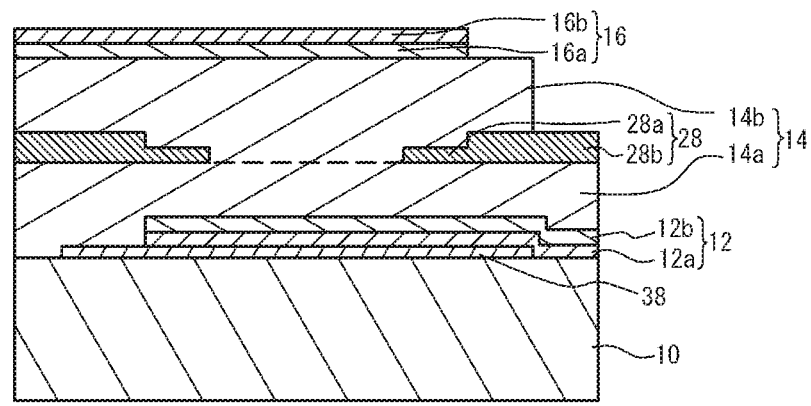

As illustrated in FIG. 4C, the piezoelectric film 14 is patterned into a desired shape by photolithography and etching. The etching may be conducted by wet etching or dry etching.

The etching liquid for the sacrifice layer 38 is introduced into the sacrifice layer 38 under the lower electrode 12 through the holes 35 and the introduction path 33 (see FIG. 1A). This process removes the sacrifice layer 38. The substance for etching the sacrifice layer 38 is preferably a substance that does not etch materials constituting the resonator except the sacrifice layer 38. Especially, the substance for etching is preferably a substance that does not etch the lower electrode 12 with which the substance for etching comes in contact. The stress of the multilayered film from the lower electrode 12 to the frequency adjusting film is set to be a compression stress. This setting causes the multilayered film to separate from the substrate 10 to the opposite side from the substrate 10 when the sacrifice layer 38 is removed. Accordingly, the air gap 30 having a dome-shaped bulge is formed between the lower electrode 12 and the substrate 10. The above processes complete the series resonator S illustrated in FIG. 1A and FIG. 1B and the parallel resonator P illustrated in FIG. 1A and FIG. 1C.

Figure 5A:
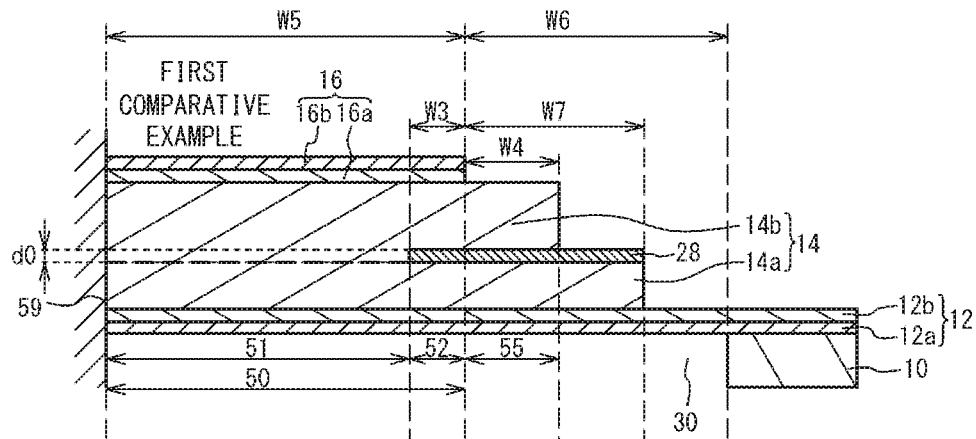
FIG. 5A through FIG. 5C respectively illustrate cross-section structures of first and second comparative examples and the first embodiment that were simulated.
Figure 5B:
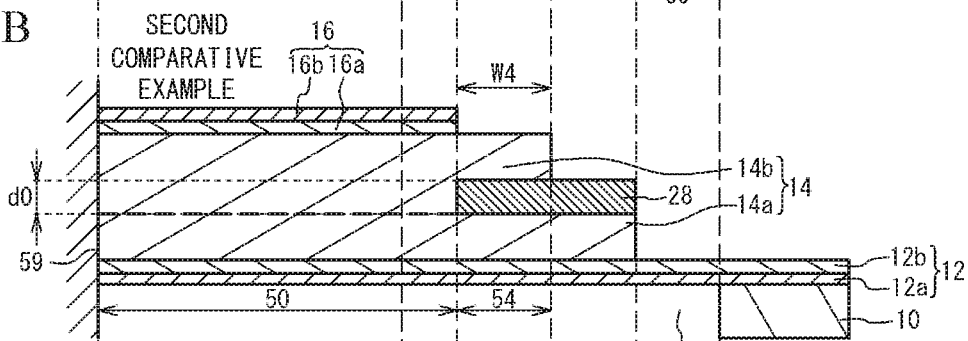
Figure 5C:
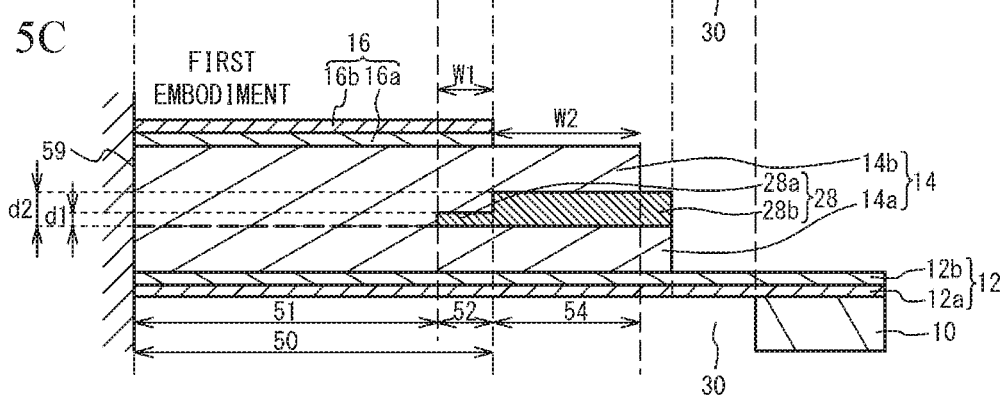

Then, the Q-value of the piezoelectric thin film resonator of the first embodiment was simulated by using a two-dimensional finite element method. FIG. 5A through FIG. 5C respectively illustrate cross-section structures of first and second comparative examples and the first embodiment that were simulated. As illustrated in FIG. 5A through FIG. 5C, it was assumed that the center of the resonance region 50 is a mirror boundary face 59. The width of the half of the resonance region 50 was assumed to be W5, the width of the air gap 30 outside the resonance region 50 was assumed to be W6, and the width of the lower piezoelectric film 14a outside the resonance region 50 was assumed to be W7.

As illustrated in FIG. 5A, in the first comparative example, the insertion film 28 is inserted in the piezoelectric film 14 in the region 52 within the resonance region 50. The insertion film 28 is not inserted in the piezoelectric film 14 in a region 51 within the resonance region 50. The insertion width and the film thickness of the insertion film 28 within the region 52 were respectively assumed to be W3 and d0. The width of the upper piezoelectric film 14b outside the resonance region 50 was assumed to be W4. The insertion film 28 is inserted in the piezoelectric film 14 in a region 55 located further out than the resonance region 50.

As illustrated in FIG. 5B, in the second comparative example, the insertion film 28 is inserted in the piezoelectric film 14 in the region 54 located further out than the resonance region 50. The insertion film 28 is not inserted in the piezoelectric film 14 in the resonance region 50. The width along which the insertion film 28 is inserted in the piezoelectric film 14 was assumed to be W4, and the film thickness of the insertion film 28 was assumed to be d0.

As illustrated in FIG. 5C, the width of the region 52 was assumed to be W1, and the film thickness of the in the insertion film 28a was assumed to be d1 in the first embodiment. The width of the region 54 was assumed to be W2, and the film thickness of the insertion film 28b was assumed to be d2.

Figure 6:
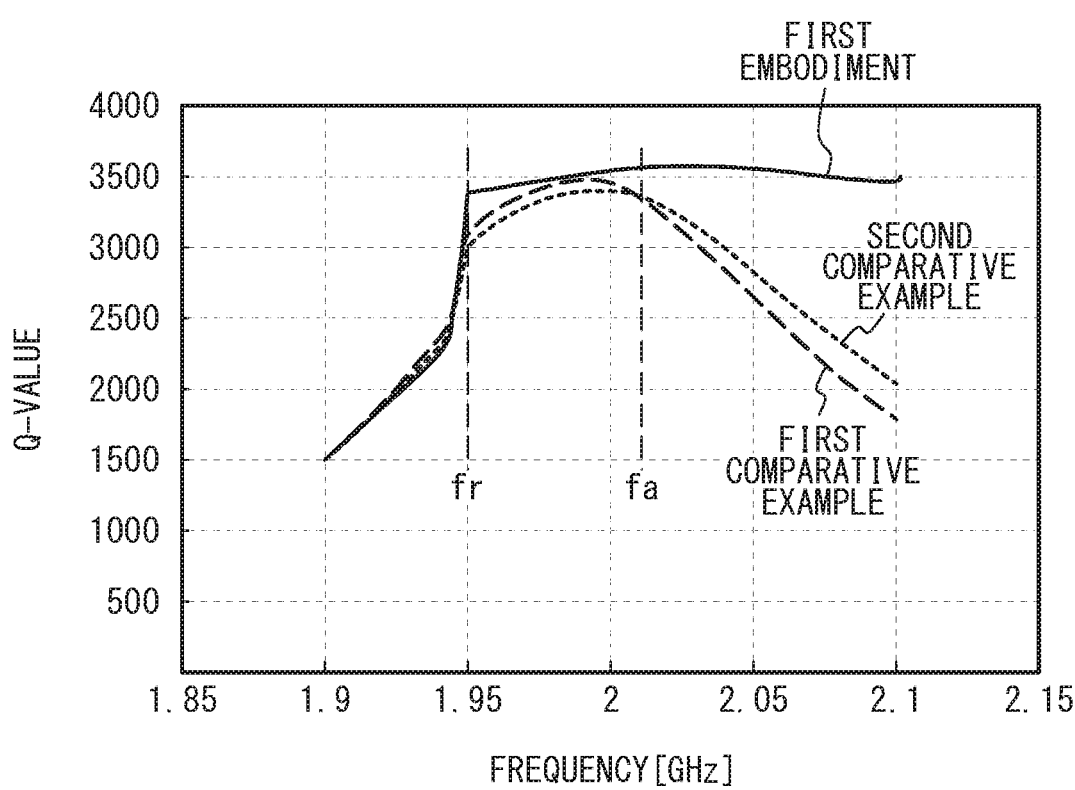
FIG. 6 is a graph of a Q-value versus frequency in the first and second comparative examples and the first embodiment.

Individual materials and individual film thicknesses used for the simulation are as follows.
Lower layer 12a of the lower electrode 12: Cr film with a film thickness of 100 nm
Upper layer 12b of the lower electrode 12: Ru film with a film thickness of 200 nm
Piezoelectric film 14: AlN film with a film thickness of 1260 nm
Lower piezoelectric film 14a: AlN film with a film thickness of 630 nm
Upper piezoelectric film 14b: AlN film with a film thickness of 630 nm
Insertion film 28: Silicon oxide film
Upper electrode 16: Ru film with a film thickness of 230 nm
Width W5 of the resonance region 50: 42 μm
Width W6 of the air gap 30 outside the resonance region 50: 13 μm
Width W7 of the lower piezoelectric film 14a outside the resonance region 50: 8 μm First Comparative Example Film thickness d0 of the insertion film 28: 150 nm
Insertion width W3 of the insertion film 28: 2200 nm Second Comparative Example Film thickness d0 of the insertion film 28: 300 nm
Insertion width W4 of the insertion film 28: 2800 nm First Embodiment Film thickness d1 of the insertion film 28a: 150 nm
Insertion width W1 of the insertion film 28a: 1800 nm
Film thickness d2 of the insertion film 28b: 300 nm
Insertion width W2 of the insertion film 28b: 3600 nm
FIG. 6 is a graph of a Q-value versus frequency in the first and second comparative examples and the first embodiment. As illustrated in FIG. 6, in the first and second comparative examples, the Q-value reaches a maximum between a resonant frequency fr and an antiresonant frequency fa. In the first embodiment, the Q-value is high in the wide band higher than the resonant frequency fr. The Q-value reaches a maximum at a frequency around 2.05 GHz, which is higher than the antiresonant frequency fa. As described above, the first embodiment has a larger range in which the Q-value is high than the first and second comparative examples.

The reason why the first embodiment improves the Q-value in the wide band will be described. The dispersion characteristic of the acoustic wave in the lateral mode (the acoustic wave propagating in the lateral direction) in the first embodiment was simulated. The simulation conditions are the same as the above conditions. The simulated mode of the acoustic wave is a primary mode used in the piezoelectric thin film resonator.

Figure 7A:
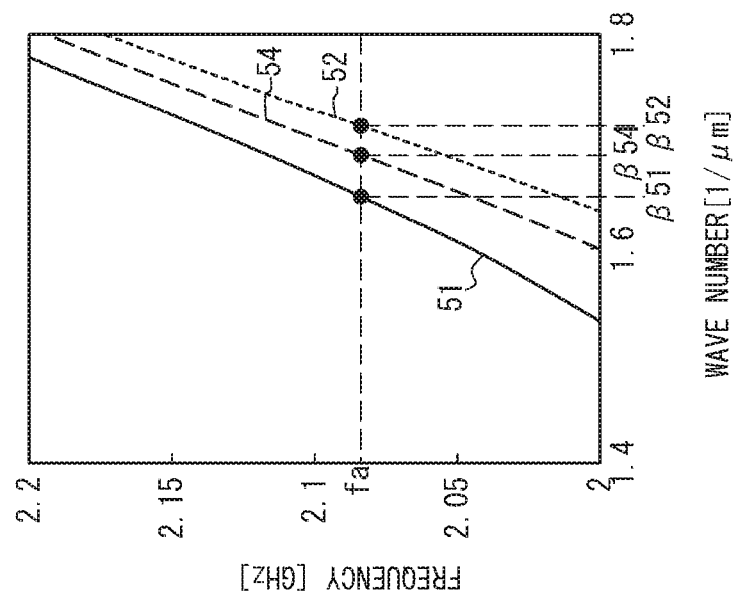
FIG. 7A illustrates the dispersion characteristic of a lateral mode in the first embodiment.
Figure 7B:
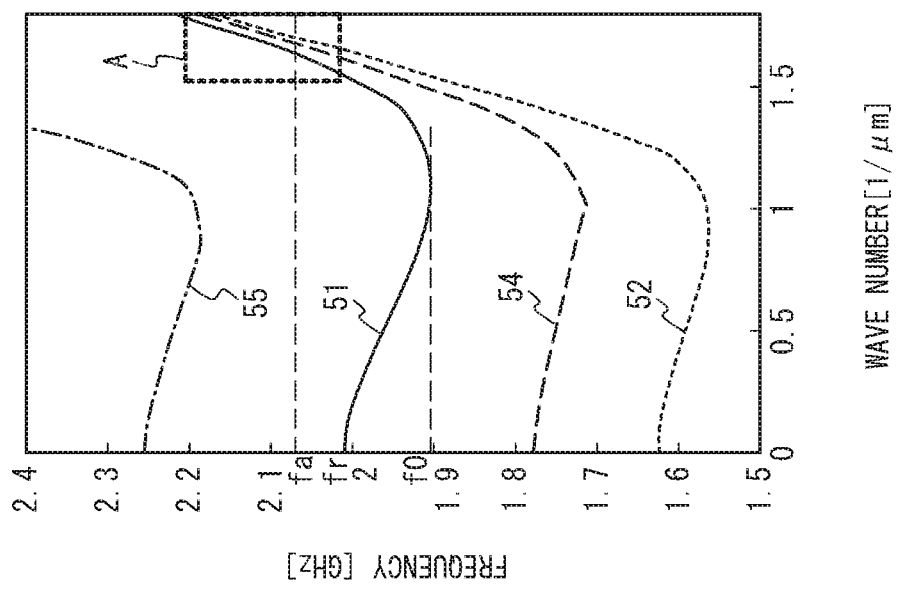
FIG. 7B is an enlarged view of a range A in FIG. 7A.

FIG. 7A illustrates the dispersion characteristic of the lateral mode in the first embodiment, and FIG. 7B is an enlarged view of a range A in FIG. 7A. In FIG. 7A, the horizontal axis represents the wave number in the lateral direction, and the vertical axis represents frequency. When the wave number is 0, the acoustic wave does not propagate in the lateral direction, and the response in the thickness extension mode occurs. When the wave number is greater than 0, the acoustic wave propagates in the lateral direction, and becomes the acoustic wave in the lateral mode. The frequency at which the wave number of the dispersion characteristic in the region 51 within the resonance region 50 is 0 corresponds to the resonant frequency fr of the piezoelectric thin film resonator. In the region 51, as the wave number increases from 0, the frequency decreases. After the frequency reaches f0, the frequency increases as the wave number increases. In the region 52, the cutoff frequency at which the wave number is 0 is lower than the resonant frequency fr. In the region 54, the cutoff frequency at which the wave number is 0 is higher than the cutoff frequency in the region 52 and lower than the resonant frequency fr. In the region 55 of the first comparative example, the cutoff frequency at which the wave number is 0 is higher than the resonant frequency fr.

As illustrated in FIG. 7B, the wave numbers in the regions 51, 52, and 54 at the antiresonant frequency fa are respectively represented by $\beta 51$, $\beta 52$, and $\beta 54$. $\beta 51 < \beta 54 < \beta 52$. In the region 55, the mode of the antiresonant frequency fa does not exist in the region where the wave number is positive. Thus, at the antiresonant frequency fa, the acoustic wave in the mode of the antiresonant frequency fa does not propagate through the region 55.

In the first comparative example, at a frequency around the antiresonant frequency fa, the wave number $\beta 52$ in the region 52 is greater than the wave number $\beta 51$ in the region 51. That is, at a frequency around the antiresonant frequency fa, the speed of the acoustic wave in the region 52 is less than the speed of the acoustic wave in the region 51. Thus, the acoustic wave propagating in the lateral direction from the region 51 is reflected by the region 52, and returns to the region 51. Accordingly, the Q-value is improved. In the region 55, the lateral mode acoustic wave does not propagate.

In the second comparative example, at a frequency around the antiresonant frequency fa, the wave number $\beta 54$ in the region 54 is greater than the wave number $\beta 51$ in the resonance region 50 (the region 51). That is, at a frequency around the antiresonant frequency fa, the speed of the acoustic wave in the region 54 is less than the speed of the acoustic wave in the resonance region 50. Thus, the acoustic wave propagating in the lateral direction from the resonance region 50 is reflected by the region 54, and returns to the resonance region 50. Accordingly, the Q-value is improved.

In the first embodiment, $\beta 51 < \beta 54 < \beta 52$. That is, the speed of the acoustic wave at a frequency around the antiresonant frequency fa is high in the region 51, low in the region 52, and high in the region 54. Thus, when the relation among the speeds of the acoustic waves in the regions 51, 52, and 54 becomes close to Bragg's condition, the acoustic wave reflected by the region 52 and the acoustic wave reflected by the region 54 amplify each other. Accordingly, the lateral mode acoustic wave reflected by the region 51 becomes larger than those of the first and second comparative examples. Thus, the leak of the acoustic wave from the resonance region 50 is reduced, and the Q-value is thus improved. As described above, the first embodiment improves the Q-value compared to the first and second comparative examples.

In the first embodiment, the insertion film 28 is located in the outer peripheral region 52 within the resonance region 50 and at least a part of a region that surrounds the resonance region 50 and is located outside the resonance region 50, and is not located in the center region 51 of the resonance region 50. The film thickness d1 (a first film thickness) of the insertion film 28a (a first part) that is located within the resonance region 50 is less than the film thickness d2 (a second film thickness) of the insertion film 28b (a second part) that is located outside the resonance region 50. This structure improves the Q-value.

In plan view, the resonance region 50 and at least a part of the insertion film 28b that has the film thickness d2 and is located outside the resonance region 50 overlap with the air gap 30. Accordingly, the acoustic wave in the lateral mode propagates through the piezoelectric film 14 in the regions 51, 52, and 54. Thus, the lateral mode acoustic wave is reflected in Bragg's condition. Accordingly, the Q-value is improved.

As illustrated in FIG. 7B, at the antiresonant frequency fa in the resonance region 50, the wave number $\beta 51$ of the lateral mode in the region 51 is smaller than the wave number $\beta 52$ of the lateral mode in the region 52 in which the insertion film 28a is located, and the wave number $\beta 54$ of the lateral mode in the region 54, which is located outside the resonance region 50 and in which the insertion film 28b is located, is smaller than the wave number $\beta 52$ of the lateral mode in the region 52 in which the insertion film 28a is located. Thus, the lateral mode acoustic wave is reflected in Bragg's condition. Accordingly, the Q-value is improved.

The insertion film 28 may be located on or under the piezoelectric film 14, but is preferably inserted in the piezoelectric film 14. This structure further improves the Q-value.

The insertion film 28a and the insertion film 28b are preferably in contact with each other. This structure further improves the Q-value.

Figure 8A:
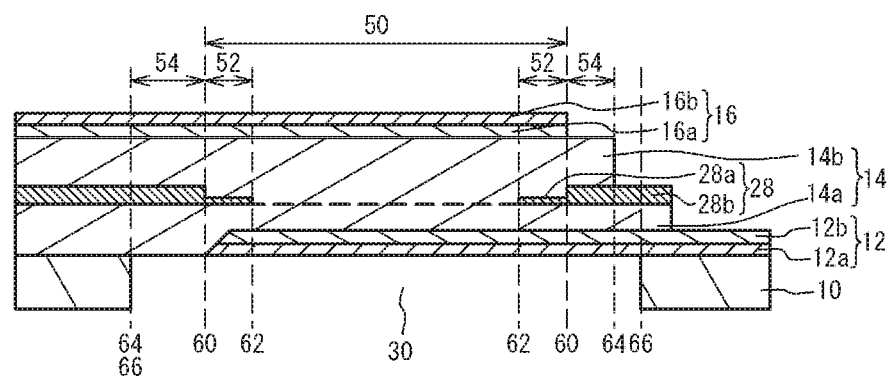
FIG. 8A through FIG. 8C are cross-sectional views of piezoelectric thin film resonators in accordance with the first embodiment and first and second variations of the first embodiment, respectively.
Figure 8B:
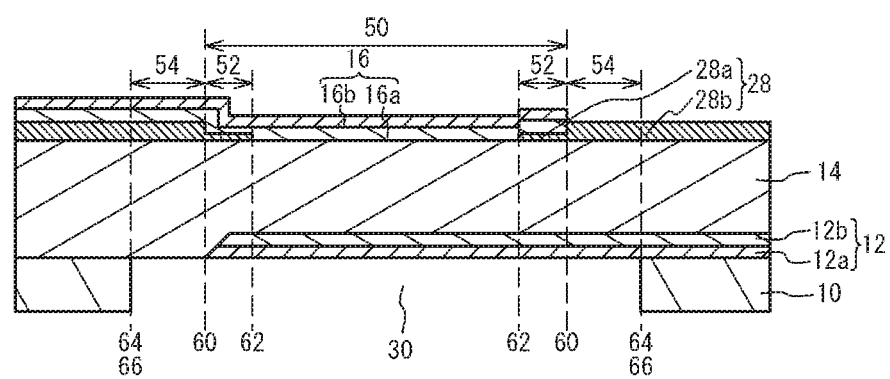
Figure 8C:
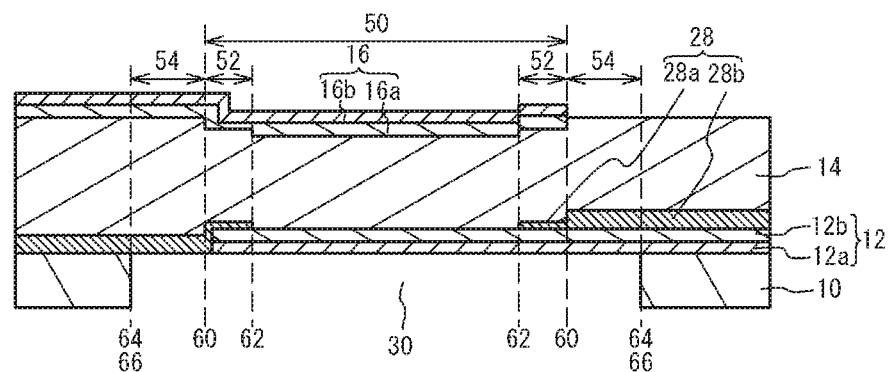

FIG. 8A through FIG. 8C are cross-sectional views of piezoelectric thin film resonators in accordance with the first embodiment and first and second variations of the first embodiment, respectively. As illustrated in FIG. 8A, in the piezoelectric thin film resonator of the first embodiment, the air gap 30 is illustrated in the substrate 10 for simplification. Other structures are the same as those in FIG. 1A through FIG. 1C.

First Variation of the First Embodiment

As illustrated in FIG. 8B, the insertion film 28 is located on the piezoelectric film 14, and is located under the upper electrode 16. Other structures are the same as those of the first embodiment, and the description thereof is thus omitted.

Second Variation of the First Embodiment

As illustrated in FIG. 8C, the insertion film 28 is located under the piezoelectric film 14, and is located on the lower electrode 12. Other structures are the same as those of the first embodiment, and the description thereof is thus omitted.

As described in the first and second variations of the first embodiment, the insertion film 28 may be located on or under the piezoelectric film 14.

Third Variation of the First Embodiment

Figure 9A:
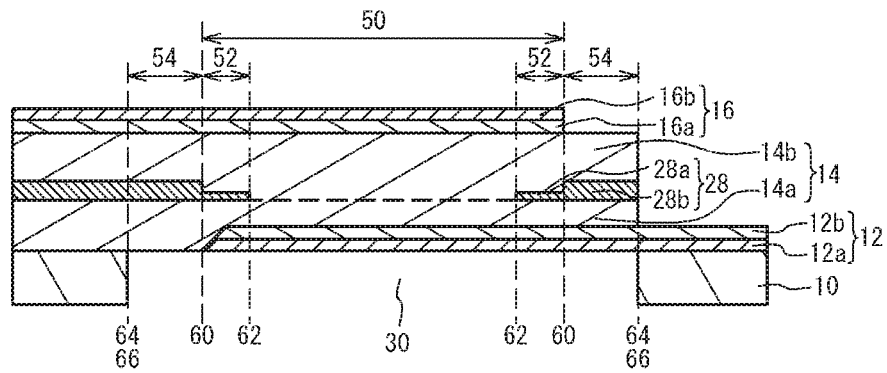
FIG. 9A through FIG. 9D are cross-sectional views of piezoelectric thin film resonators in accordance with third through sixth variations of the first embodiment, respectively.

FIG. 9A through FIG. 9D are cross-sectional views of piezoelectric thin film resonators in accordance with third through sixth variations of the first embodiment, respectively. As illustrated in FIG. 9A, in the region other than the extraction region of the upper electrode 16, the outer outlines of the lower piezoelectric film 14a, the upper piezoelectric film 14b, and the insertion film 28 are substantially aligned with the outer outline 66 of the air gap 30. Thus, the outer outline 64 of the region 54 is substantially aligned with the outer outline 66 of the air gap 30. Other structures are the same as those of the first embodiment, and the description thereof is thus omitted.

Fourth Variation of the First Embodiment

Figure 9B:
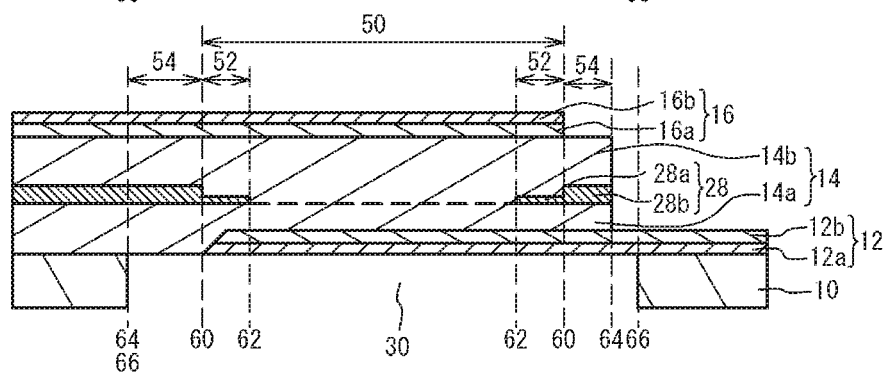

As illustrated in FIG. 9B, the outer outlines of the lower piezoelectric film 14a, the upper piezoelectric film 14b, and the insertion film 28 are located between the outer outline 66 of the air gap 30 and the outer outline 60 of the resonance region 50. The outer outline 64 of the region 54 is located further in than the outer outline 66 of the air gap 30. Other structures are the same as those of the first embodiment, and the description thereof is thus omitted.

Fifth Variation of the First Embodiment

Figure 9C:
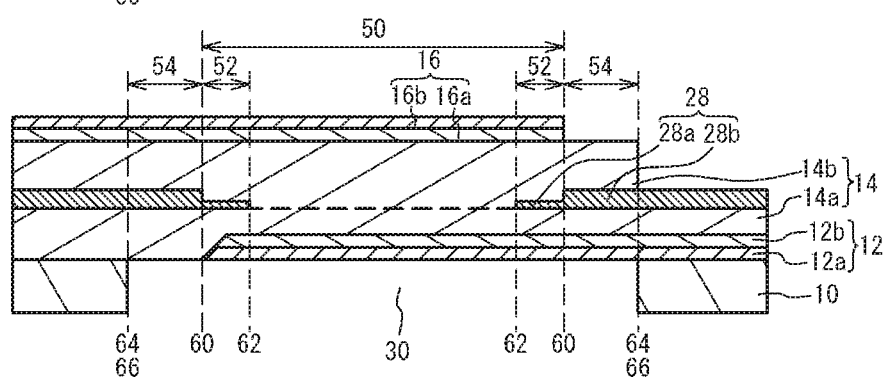

As illustrated in FIG. 9C, the lower piezoelectric film 14a and the insertion film 28 extend to the outside of the outer outline 66 of the air gap 30. The outer outline of the upper piezoelectric film 14b is substantially aligned with the outer outline 66 of the air gap 30. Thus, the outer outline 64 of the region 54 is substantially aligned with the outer outline 66 of the air gap 30. Other structures are the same as those of the first embodiment, and the description thereof is thus omitted.

Sixth Variation of the First Embodiment

Figure 9D:
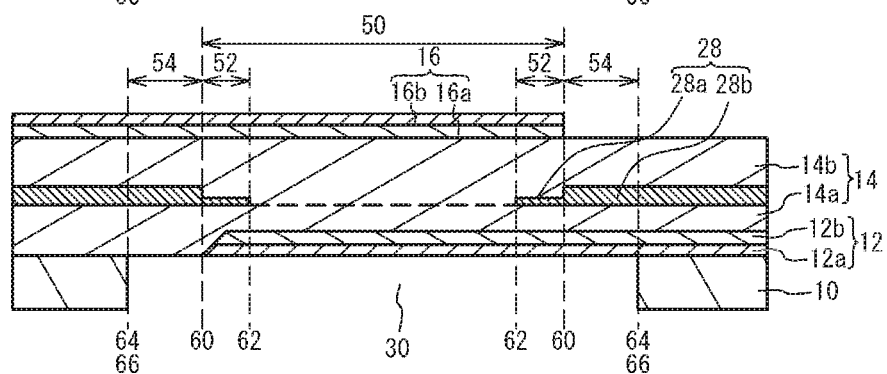

As illustrated in FIG. 9D, the lower piezoelectric film 14a, the upper piezoelectric film 14b, and the insertion film 28 extend to the outside of the outer outline 66 of the air gap 30. Thus, the outer outline 64 of the region 54 is substantially aligned with the outer outline 66 of the air gap 30. Other structures are the same as those of the first embodiment, and the description thereof is thus omitted.

As described in the third through sixth variations of the first embodiment, each of the outer outlines of the lower piezoelectric film 14a, the insertion film 28b, and the upper piezoelectric film 14b may be located further in than, further out than, or substantially aligned with the outer outline 66 of the air gap 30.

Seventh Variation of the First Embodiment

Figure 10A:
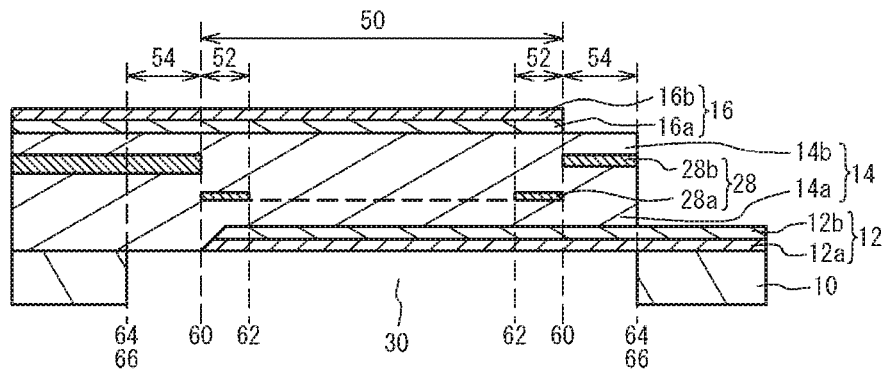
FIG. 10A through FIG. 10D are cross-sectional views of a seventh variation of the first embodiment.

FIG. 10A through FIG. 10D are cross-sectional views of a seventh variation of the first embodiment. As illustrated in FIG. 10A, the insertion film 28a is inserted in the piezoelectric film 14. The insertion film 28b is located at a position different from the position of the insertion film 28a in the thickness direction of the piezoelectric film 14. Other structures are the same as those of the third variation of the first embodiment, and the description thereof is thus omitted.

Figure 10B:
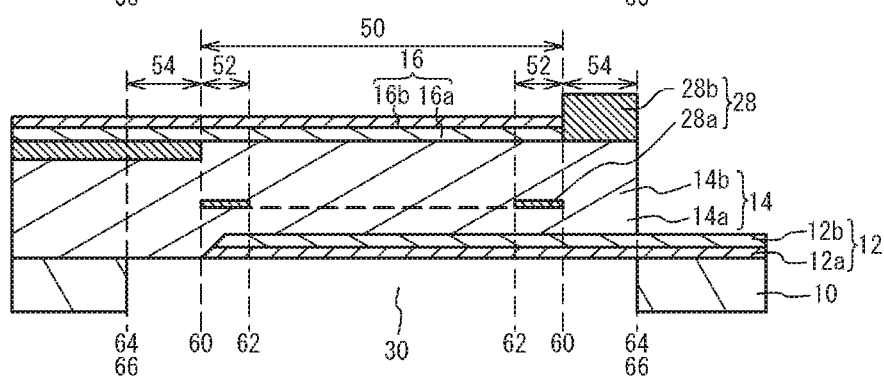

As illustrated in FIG. 10B, the insertion film 28a is inserted in the piezoelectric film 14. The insertion film 28b is located on the piezoelectric film 14. In the extraction region of the upper electrode 16, the insertion film 28b is located between the piezoelectric film 14 and the upper electrode 16. Other structures are the same as those of the third variation of the first embodiment, and the description thereof is thus omitted.

Figure 10C:
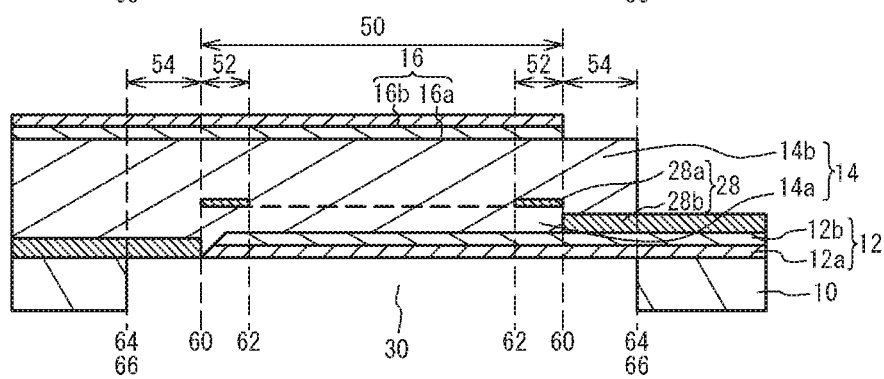

As illustrated in FIG. 10C, the insertion film 28a is inserted in the piezoelectric film 14. The insertion film 28b is located under the piezoelectric film 14. In the extraction region of the lower electrode 12, the insertion film 28b is located between the piezoelectric film 14 and the lower electrode 12. Other structures are the same as those of the third variation of the first embodiment, and the description thereof is thus omitted.

Figure 10D:
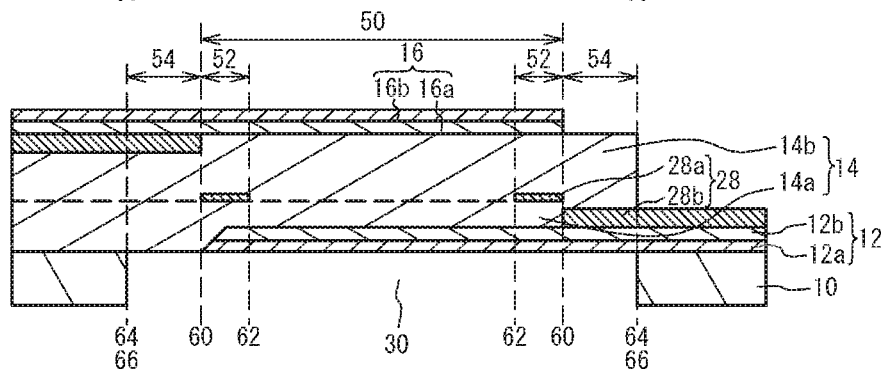

As illustrated in FIG. 10D, the insertion film 28a is inserted in the piezoelectric film 14. In the extraction region of the upper electrode 16, the insertion film 28b is located between the piezoelectric film 14 and the upper electrode 16. In the extraction region of the lower electrode 12, the insertion film 28b is located between the piezoelectric film 14 and the lower electrode 12. Other structures are the same as those of the third variation of the first embodiment, and the description thereof is thus omitted.

As described in the first embodiment and the first through sixth variations thereof, the insertion films 28a and 28b may be in contact with each other. As described in the seventh variation of the first embodiment, the insertion films 28a and 28b may be located at different positions in the thickness direction.

Eighth Variation of the First Embodiment

Figure 11A:
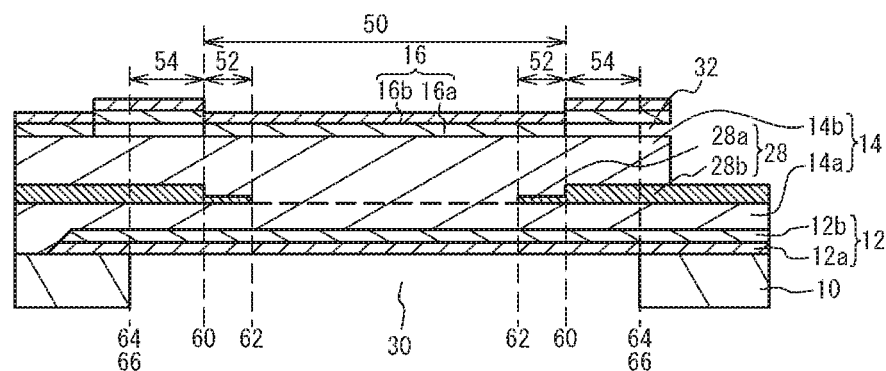
FIG. 11A through FIG. 11C are cross-sectional views of an eighth variation of the first embodiment.
Figure 11B:
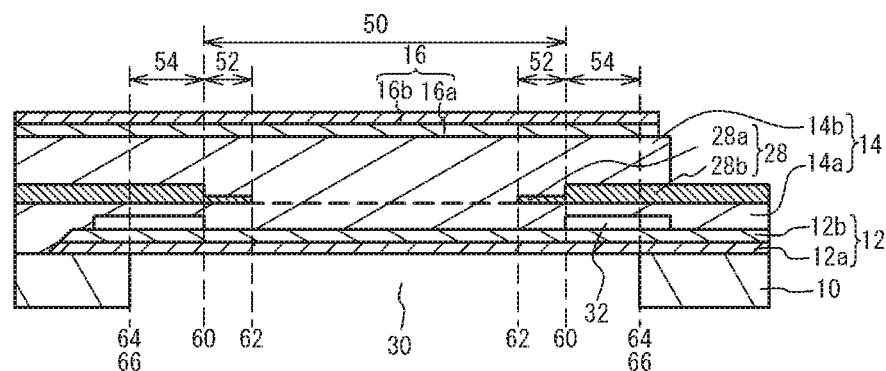
Figure 11C:
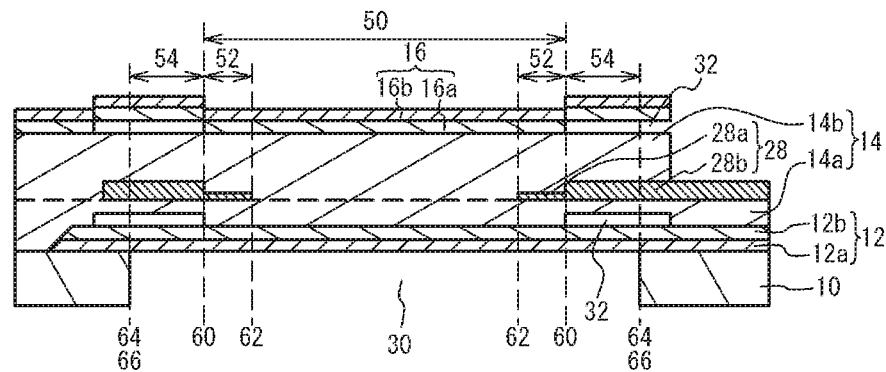

FIG. 11A through FIG. 11C are cross-sectional views of an eighth variation of the first embodiment. As illustrated in FIG. 11A, an air gap 32 is located between the piezoelectric film 14 and the upper electrode 16 in the region 54. Other structures are the same as those of the first embodiment, and the description thereof is thus omitted.

As illustrated in FIG. 11B, the air gaps 32 is located between the lower electrode 12 and the piezoelectric film 14 in the region 54. Other structures are the same as those of the first embodiment, and the description thereof is thus omitted.

As illustrated in FIG. 11C, the air gaps 32 are located between the piezoelectric film 14 and the upper electrode 16 and between the lower electrode 12 and the piezoelectric film 14 in the region 54. Other structures are the same as those of the first embodiment, and the description thereof is thus omitted.

As described in the eighth variation of the first embodiment, in the regions 52 and 54, the air gap 32 may be located between the piezoelectric film 14 and the lower electrode 12, between the piezoelectric film 14 and the upper electrode 16, or between the piezoelectric film 14 and the lower electrode 12 and between the piezoelectric film 14 and the upper electrode 16. In this case, the resonance region 50 is, for example, a region in which the air gap 32 is not provided.

Ninth Variation of the First Embodiment

Figure 12A:
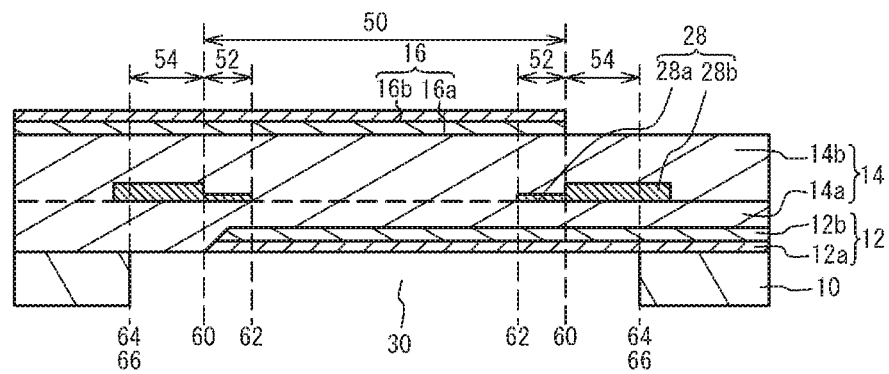
FIG. 12A through FIG. 12C are cross-sectional views of ninth through eleventh variations of the first embodiment, respectively.
Figure 12B:
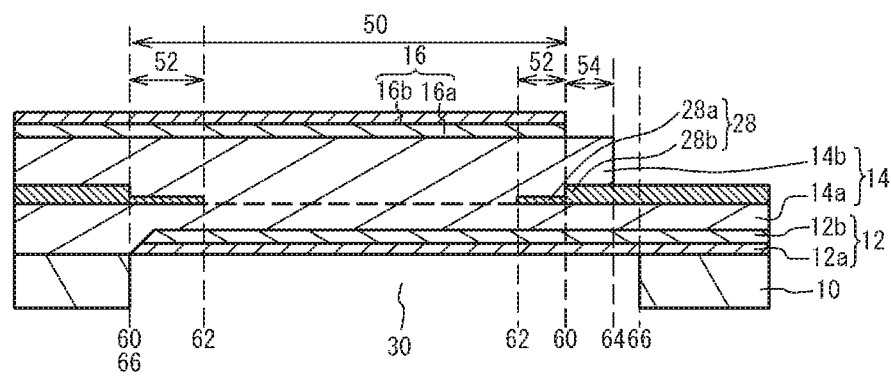
Figure 12C:
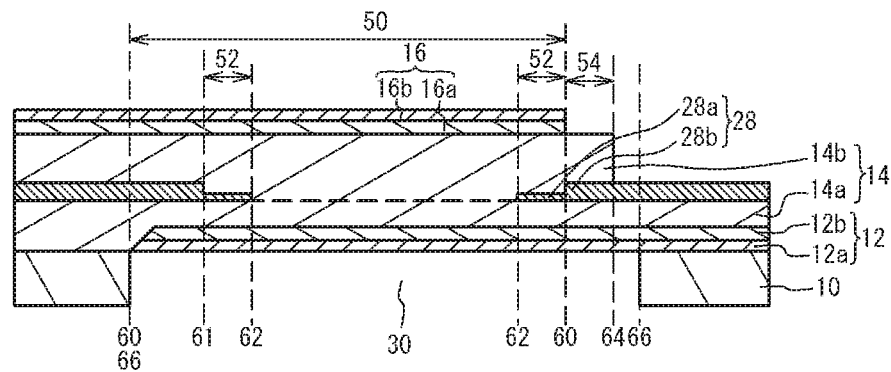

FIG. 12A through FIG. 12C are cross-sectional views in accordance with ninth through eleventh variations of the first embodiment, respectively. As illustrated in FIG. 12A, the outer outline of the insertion film 28b is located further out than the outer outline 66 of the air gap 30. Thus, the outer outline 64 of the region 54 is substantially aligned with the outer outline 66 of the air gap 30. Other structures are the same as those of the sixth variation of the first embodiment, and the description thereof is thus omitted.

Tenth Variation of the First Embodiment

As illustrated in FIG. 12B, in the extraction region of the upper electrode 16, the outer outline of the region 52 is substantially aligned with the outer outline 66 of the air gap 30. In the extraction region of the upper electrode 16, the thick insertion film 28b does not overlap with the air gap 30. In the extraction region of the lower electrode 12, the region 54 is provided in the same manner as that in the first embodiment. Other structures are the same as those of the sixth variation of the first embodiment, and the description thereof is thus omitted.

Eleventh Variation of the First Embodiment

As illustrated in FIG. 12C, in the extraction region of the upper electrode 16, an outer outline 61 of the region 52 is located further in than the outer outline 60 of the resonance region 50. In a region that is the extraction region of the upper electrode 16 and located further out than the resonance region 50, the thick insertion film 28b does not overlap with the air gap 30. In the extraction region of the lower electrode 12, the region 54 is provided in the same manner as that in the first embodiment. Other structures are the same as those of the sixth variation of the first embodiment, and the description thereof is thus omitted.

As described in the tenth and eleventh variations of the first embodiment, it is only required that the region 54 that is located further out than the resonance region 50 and in which the insertion film 28b overlaps with the air gap 30 is located in at least a part of a region surrounding the resonance region 50. It is only required that the regions 52 and 54 are provided in at least a part of the region surrounding the resonance region 50.

Second Embodiment

Figure 13A:
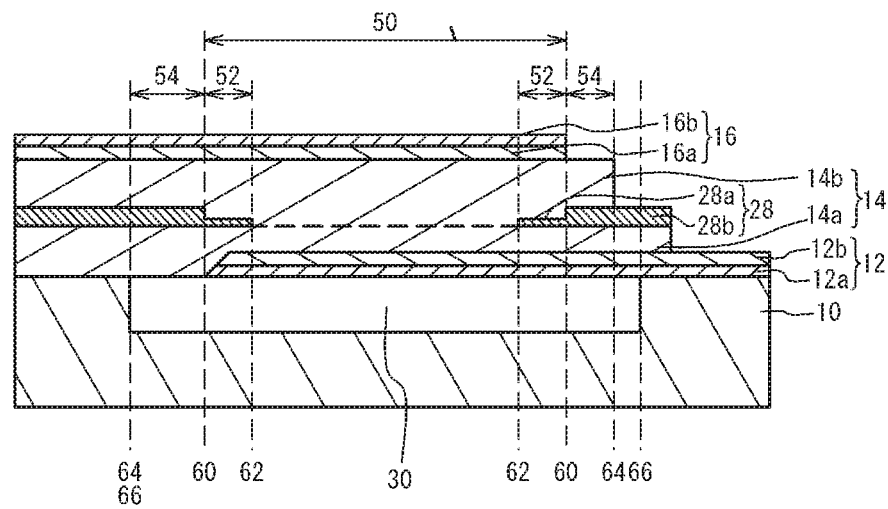
FIG. 13A is a cross-sectional view of a piezoelectric thin film resonator in accordance with a second embodiment.
Figure 13B:
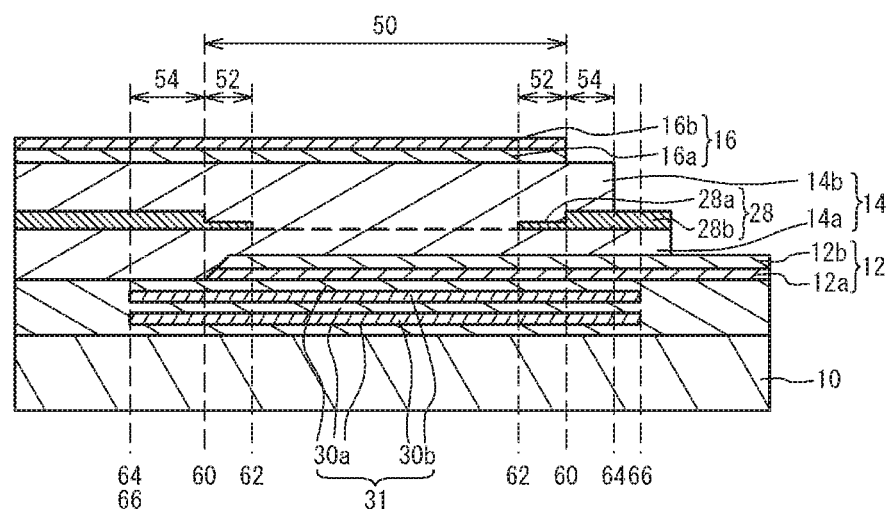
FIG. 13B is a cross-sectional view of a piezoelectric thin film resonator in accordance with a first variation of the second embodiment.

A second embodiment and a first variation thereof change the structure of the air gap. FIG. 13A is a cross-sectional view of a piezoelectric thin film resonator of the second embodiment, and FIG. 13B is a cross-sectional view of a piezoelectric thin film resonator of the first variation of the second embodiment. As illustrated in FIG. 13A, a recessed portion is formed on the upper surface of the substrate 10. The lower electrode 12 is flatly formed on the substrate 10. Thus, the air gap 30 is formed in the recessed portion of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film being in contact with the lower surface of the lower electrode 12 may be formed. That is, the air gap 30 may be formed between the substrate 10 and the insulating film being in contact with the lower electrode 12. The insulating film may be, for example, an aluminum nitride film.

As illustrated in FIG. 13B, an acoustic mirror 31 is formed under the lower electrode 12 in the resonance region 50. The acoustic mirror 31 includes films 30a with low acoustic impedance and films 30b with high acoustic impedance alternately stacked. The film thickness of each of the films 30a and 30b is, for example, λ/4 (λ is the wavelength of the acoustic wave). The number of the films 30a and the films 30b to be stacked can be freely selected. It is only required that the acoustic mirror 31 is formed of two different layers having different acoustic characteristics stacked at intervals. Alternatively, the substrate 10 may be one of two different layers having different acoustic characteristics of the acoustic mirror 31. For example, the acoustic mirror 31 may have a structure in which a single film having acoustic impedance different from that of the substrate 10 is located in the substrate 10. Other structures are the same as those of the first embodiment, and the description thereof is thus omitted.

In the first embodiment and the variations thereof, the air gap 30 may be formed as in the second embodiment, or the acoustic mirror 31 may be formed instead of the air gap 30 as in the first variation of the second embodiment.

As described in the first embodiment and the variations thereof and the second embodiment, the piezoelectric thin film resonator may be a Film Bulk Acoustic Resonator (FBAR) in which the air gap 30 is formed between the substrate 10 and the lower electrode 12 in the resonance region 50. Alternatively, as described in the first variation of the second embodiment, the piezoelectric thin film resonator may be a Solidly Mounted Resonator (SMR) having the acoustic mirror 31 that reflects the acoustic wave propagating through the piezoelectric film 14 under the lower electrode 12 in the resonance region 50.

In the first and second embodiments and the variations thereof, the insertion film 28 is provided so as to entirely surround the resonance region 50, but it is only required that the insertion film 28 is located further out than the resonance region 50 in at least a part of the resonance region 50. For example, the regions 52 and 54 may have a ring shape of which a part is cut. A case where the resonance region 50 has an elliptical shape is described, but the resonance region 50 may have other shapes. For example, the resonance region 50 may have a polygonal shape such as a quadrangle shape or a pentagonal shape.

Third Embodiment

Figure 14A:
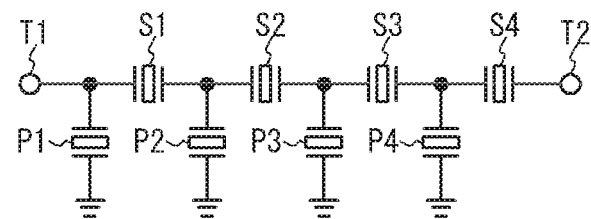
FIG. 14A is a circuit diagram of a filter in accordance with a third embodiment.

A third embodiment is an exemplary filter and an exemplary duplexer including the piezoelectric thin film resonator according to any one of the first and second embodiments and the variations thereof. FIG. 14A is a circuit diagram of a filter in accordance with a third embodiment. As illustrated in FIG. 14A, between an input terminal T1 and an output terminal T2, one or more series resonators S1 through S4 are connected in series. Between the input terminal T1 and the output terminal T2, one or more parallel resonators P1 through P4 are connected in parallel. At least one of one or more series resonators S1 through S4 and one or more parallel resonators P1 through P4 may be the acoustic wave resonator according to any one of the first and second embodiments and the variations thereof. The number of resonators in the ladder-type filter can be freely selected.

Figure 14B:
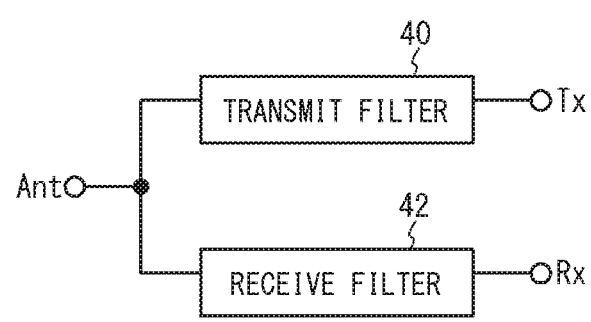
FIG. 14B is a circuit diagram of a duplexer in accordance with a variation of the third embodiment.

FIG. 14B is a circuit diagram of a duplexer in accordance with a variation of the third embodiment. As illustrated in FIG. 14B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the third embodiment.

The filter includes the piezoelectric thin film resonator according to any one of the first and second embodiments and the variations thereof. Accordingly, the Q-value of the resonator is improved, and the skirt characteristic of the filter is thus improved.

Additionally, at least one of the transmit filter 40 and the receive filter 42 may be the filter including the piezoelectric thin film resonator according to any one of the first and second embodiments and the variations thereof.

First Example

Figure 15A:
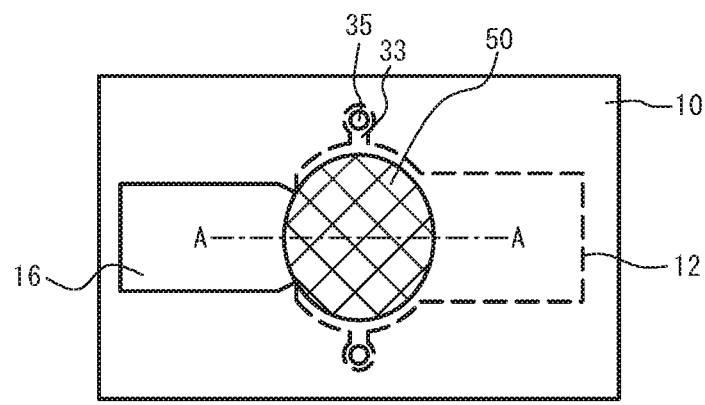
FIG. 15A is a plan view of a piezoelectric thin film resonator in accordance with a first example.
Figure 15B:
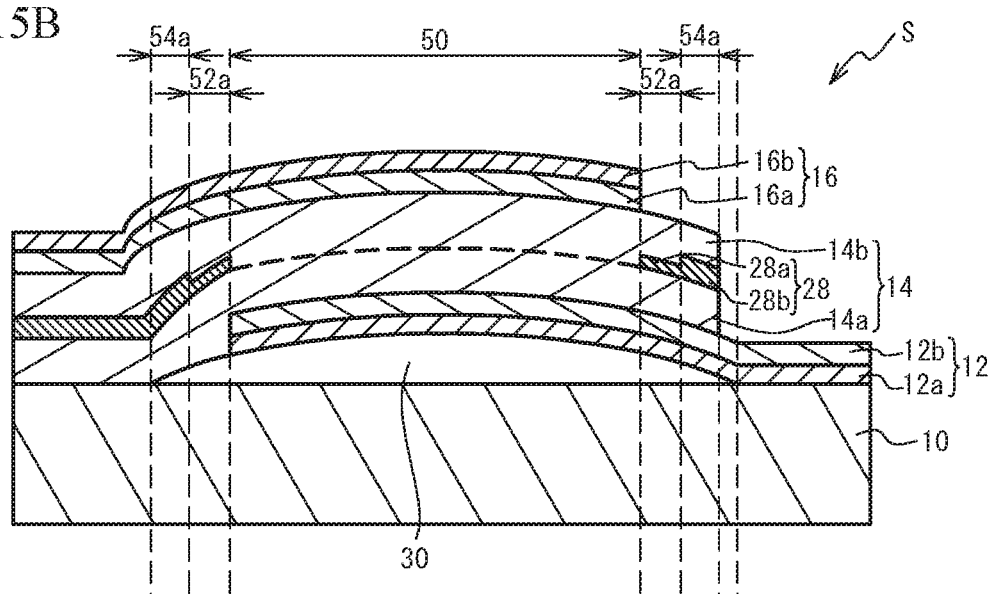
FIG. 15B and FIG. 15C are cross-sectional views taken along line A-A in FIG. 15A.
Figure 15C:
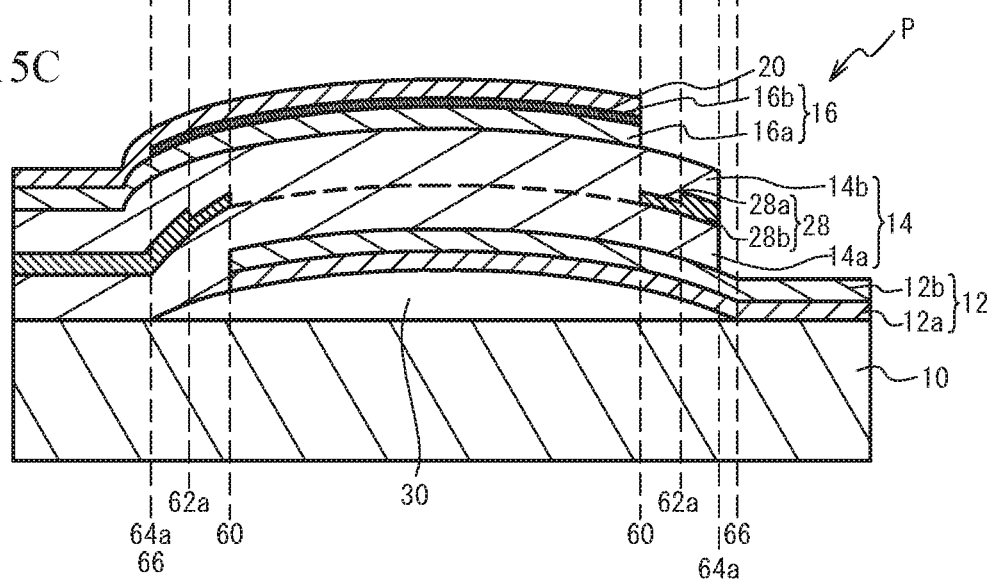

FIG. 15A is a plan view of a piezoelectric thin film resonator in accordance with a first example, and FIG. 15B and FIG. 15C are cross-sectional views taken along line A-A in FIG. 15A. FIG. 15B illustrates, for example, a series resonator of a ladder-type filter, and FIG. 15C illustrates, for example, a parallel resonator of the ladder-type filter.

With reference to FIG. 15A and FIG. 15B, the structure of the series resonator S will be described. The lower electrode 12 is located on the substrate 10 that is a silicon (Si) substrate. The air gap 30 having a dome-shaped bulge is formed between the flat principal surface of the substrate 10 and the lower electrode 12. The dome-shaped bulge is, for example, a bulge having a shape in which the height of the air gap 30 is low in the periphery of the air gap 30 and increases at closer distances to the center of the air gap 30. The lower electrode 12 includes the lower layer 12a and the upper layer 12b. The lower layer 12a is, for example, a chrome (Cr) film, and the upper layer 12b is, for example, a ruthenium (Ru) film.

Located on the lower electrode 12 is the piezoelectric film 14 mainly composed of aluminum nitride (AlN) having the main axis in the (002) direction. The piezoelectric film 14 includes the lower piezoelectric film 14a and the upper piezoelectric film 14b. The insertion film 28 is located between the lower piezoelectric film 14a and the upper piezoelectric film 14b.

The upper electrode 16 is located on the piezoelectric film 14 so as to have a region (the resonance region 50) where the upper electrode 16 faces the lower electrode 12 across the piezoelectric film 14. The resonance region 50 has an elliptical shape, and is a region in which the acoustic wave in the thickness extension mode resonates. The upper electrode 16 includes the lower layer 16a and the upper layer 16b. The lower layer 16a is, for example, a Ru film, and the upper layer 16b is, for example, a Cr film.

The insertion film 28 is located in regions 52a and 54a, and is not located in the resonance region 50. The region 52a is located further out than the resonance region 50, and the region 54a is located further out than the region 52a. The region 52a is a region that overlaps with the air gap 30 in plan view and in which the thin insertion film 28a is inserted in the piezoelectric film 14. The region 54a is a region that overlaps with the air gap 30 in plan view and in which the thick insertion film 28b is inserted in the piezoelectric film 14.

A frequency adjusting film and/or a passivation film such as a silicon oxide film may be formed on the upper electrode 16. The multilayered film within the resonance region 50 includes the lower electrode 12, the piezoelectric film 14, and the upper electrode 16.

As illustrated in FIG. 15A, the introduction path 33 for etching a sacrifice layer is formed in the lower electrode 12.

The sacrifice layer is a layer for forming the air gap 30. The vicinities of the tips of the introduction path 33 are not covered with the piezoelectric film 14, and the lower electrode 12 has the holes 35 at the ends of the introduction path 33.

With reference to FIG. 15C, the structure of the parallel resonator P will be described. The parallel resonator P differs from the series resonator S in that the mass load film 20 made of a titanium (Ti) layer is located between the lower layer 16a and the upper layer 16b of the upper electrode 16. Thus, the multilayered film includes the mass load film 20 formed across the entire surface in the resonance region 50 in addition to the multilayered film of the series resonator S. The difference in resonant frequency between the series resonator S and the parallel resonator P is adjusted with use of the film thickness of the mass load film 20. Other structures are the same as those of the series resonator S illustrated in FIG. 15B, and the description thereof is thus omitted.

When the piezoelectric thin film resonator has a resonant frequency of 2 GHz, the piezoelectric thin film resonator is configured as follows. The lower layer 12a of the lower electrode 12 is a Cr film with a film thickness of 100 nm, and the upper layer 12b is a Ru film with a film thickness of 200 nm. The piezoelectric film 14 is an AlN film with a film thickness of 1200 nm. The insertion film 28a is a silicon oxide ($SiO_2$) film with a film thickness of 205 nm, and the insertion film 28b is a $SiO_2$ film with a film thickness of 300 nm. The insertion film 28 is located in the middle in the film thickness of the piezoelectric film 14. The lower layer 16a of the upper electrode 16 is a Ru film with a film thickness of 230 nm, and the upper layer 16b is a Cr film with a film thickness of 50 nm. The frequency adjusting film is a silicon oxide film with a film thickness of 50 nm. The mass load film 20 is a Ti film with a film thickness of 120 nm. The film thickness of each layer is appropriately set so as to achieve a desired resonance characteristic.

As described in Patent Document 2, the Young's modulus of the insertion film 28 is preferably less than that of the piezoelectric film 14. When the densities are approximately the same, the Young's modulus correlates with acoustic impedance. Thus, the acoustic impedance of the insertion film 28 is preferably less than that of the piezoelectric film 14. This configuration improves the Q-value. Furthermore, to make the acoustic impedance of the insertion film 28 less than that of the piezoelectric film 14, the insertion film 28 is preferably an aluminum (Al) film, a gold (Au) film, a copper (Cu) film, a Ti film, a platinum (Pt) film, a tantalum (Ta) film, a Cr film, or a silicon oxide film when the piezoelectric film 14 is mainly composed of aluminum nitride. Especially from the viewpoint of Young's modulus, the insertion film 28 is preferably an Al film or a silicon oxide film.

The substrate 10 may be, instead of a Si substrate, a sapphire substrate, an alumina substrate, a spinel substrate, a quartz substrate, a glass substrate, a ceramic substrate, or a GaAs substrate. The lower electrode 12 and the upper electrode 16 may be formed of a single-layer film of Al, Ti, Cu, molybdenum (Mo), tungsten (W), Ta, Pt, rhodium (Rh), or iridium (Ir) or a multilayered film of at least two of them instead of Ru and Cr. For example, the lower layer 16a of the upper electrode 16 may be made of Ru, and the upper layer 16b may be made of Mo.

The piezoelectric film 14 may be made of zinc oxide (ZnO), lead zirconate titanate (PZT), or lead titanate (Pb-$TiO_3$) instead of aluminum nitride. Alternatively, for example, the piezoelectric film 14 may be mainly composed of aluminum nitride, and contain other elements for improving the resonance characteristic or the piezoelectricity. For example, the use of scandium (Sc), a Group II element and a Group IV element, or a Group II element and a Group V element as additive elements improves the piezoelectricity of the piezoelectric film 14. Accordingly, the effective electromechanical coupling coefficient of the piezoelectric thin film resonator is improved. The Group II element is, for example, calcium (Ca), magnesium (Mg), strontium (Sr), or zinc (Zn). The Group IV element is, for example, Ti, zirconium (Zr), or hafnium (Hf). The Group V element is, for example, Ta, niobium (Nb), or vanadium (V). Alternatively, the piezoelectric film 14 may be mainly composed of aluminum nitride and contain boron (B).

The frequency adjusting film may be a silicon nitride film or an aluminum nitride instead of a silicon oxide film. The mass load film 20 may be a single-layer film of Ru, Cr, Al, Cu, Mo, W, Ta, Pt, Rh, or Ir instead of Ti. Alternatively, the mass load film 20 may be, for example, an insulating film made of metal nitride such as silicon nitride or metal oxide such as silicon oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers (the lower layer 16a and the upper layer 16b) of the upper electrode 16. The mass load film 20 may be larger than the resonance region 50 as long as it is formed so as to include the resonance region 50.

Figure 16:
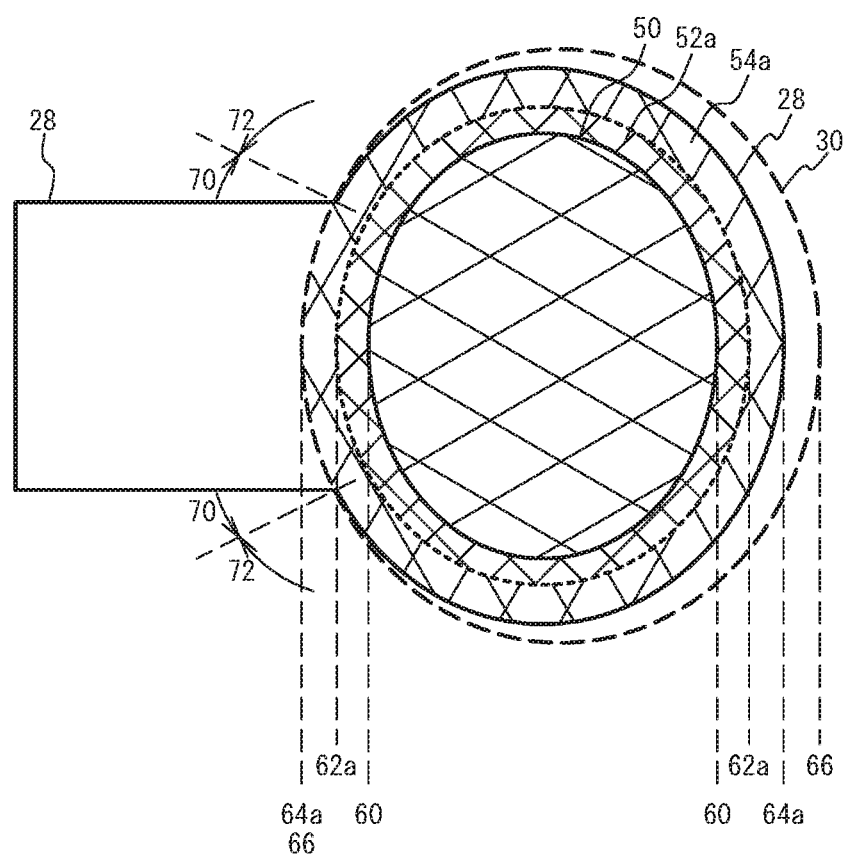
FIG. 16 is a plan view illustrating a positional relation among the resonance region, the insertion film, and the air gap around the resonance region of the piezoelectric thin film resonator in accordance with the first example.

FIG. 16 is a plan view illustrating a positional relation among the resonance region, the insertion film, and the air gap around the resonance region of the piezoelectric thin film resonator of the first example. For easy understanding, the ratio of length in FIG. 16 is not necessarily the same as that in FIG. 15A and FIG. 15C.

FIG. 15B through FIG. 16 illustrate the outer outline 60, which is the outer outline of the resonance region 50, an outer outline 62a of the region 52a that overlaps with the air gap 30 and in which the thin insertion film 28a is inserted in the piezoelectric film 14, an outer outline 64a of the region 54a that overlaps with the air gap 30 and in which the thick insertion film 28b is inserted in the piezoelectric film 14, and the outer outline 66 of the air gap 30. In a region surrounding the resonance region 50, illustrated are the extraction region 70 in which the upper electrode 16 is extracted from the resonance region 50 and the region 72 other than the extraction region 70 of the region surrounding the resonance region 50.

In each film, when the edge surface is inclined or curved in the film thickness direction, the outer outline is the outermost of the inclined or curved edge surface, and the inner outline is the innermost of the inclined or curved edge surface. The expression "one thing is substantially aligned with another thing" means that one thing is aligned with another thing to the extent of the variability in the fabrication process or an alignment accuracy in the fabrication process.

In the extraction region 70, the outer outline of the lower electrode 12 corresponds to the outer outline 60 of the resonance region 50. In the region 72, the outer outline of the upper electrode 16 corresponds to the outer outline 60 of the resonance region 50.

In the extraction region 70, the thick insertion film 28b is located under the upper electrode 16. Since the region 54a overlaps with the air gap 30, the outer outline 64a of the region 54a is substantially aligned with the outer outline 66 of the air gap 30. In the region 72, the outer outline 66 of the air gap 30 is located further out than the outer outline 64a of the region 54a. In the extraction region 70 and the region 72, the region 52a is located further out than the resonance region 50 and is in contact with the resonance region 50. The region 54a is located further out than the region 52a and is in contact with the region 52a. The regions 52a and 54a are located in a ring shape. The width of the region 52a is substantially uniform, and the width of the region 54a is substantially uniform.

Figure 17A:
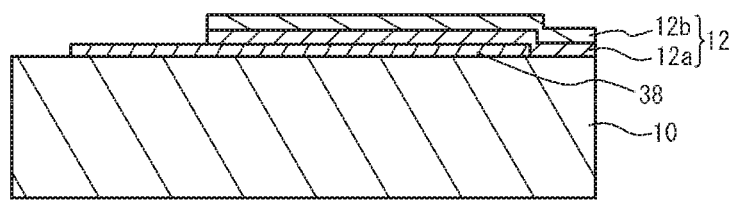
FIG. 17A through FIG. 17D are cross-sectional views (No. 1) illustrating a method of fabricating a series resonator of the first example.

FIG. 17A through FIG. 18C are cross-sectional views illustrating a method of fabricating the series resonator of the first example. As illustrated in FIG. 17A, the sacrifice layer 38 for forming an air gap is formed on the substrate 10 having a flat principal surface. The sacrifice layer 38 has a film thickness of, for example, 10 to 100 nm, and is made of a material selected from materials such as magnesium oxide (MgO), ZnO, germanium (Ge) or silicon oxide (SiO$_2$) that easily dissolve in an etching liquid or an etching gas. The sacrifice layer 38 is then patterned into a desired shape by photolithography and etching. The sacrifice layer 38 has a shape corresponding to the planar shape of the air gap 30, and includes a region to be, for example, the resonance region 50. Then, the lower layer 12a and the upper layer 12b as the lower electrode 12 are formed on the sacrifice layer 38 and the substrate 10. The sacrifice layer 38 and the lower electrode 12 are formed by, for example, sputtering, vacuum evaporation, or Chemical Vapor Deposition (CVD). Then, the lower electrode 12 is patterned into a desired shape by photolithography and etching. The lower electrode 12 may be formed by liftoff.

Figure 17B:
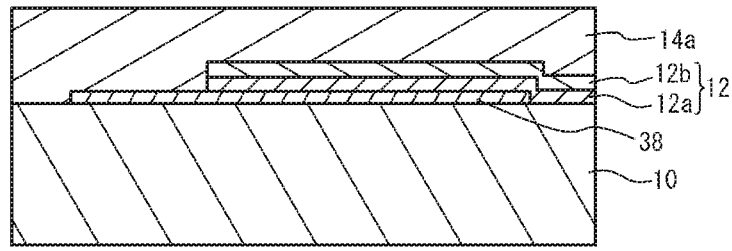
Figure 17C:
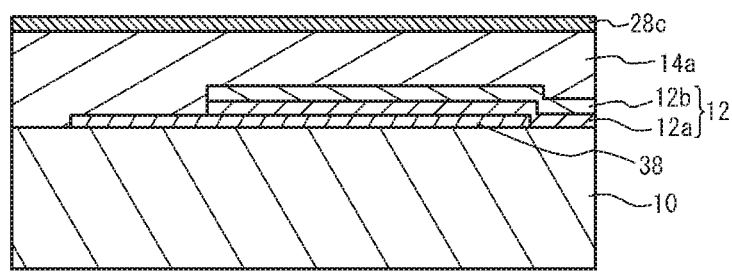
Figure 17D:
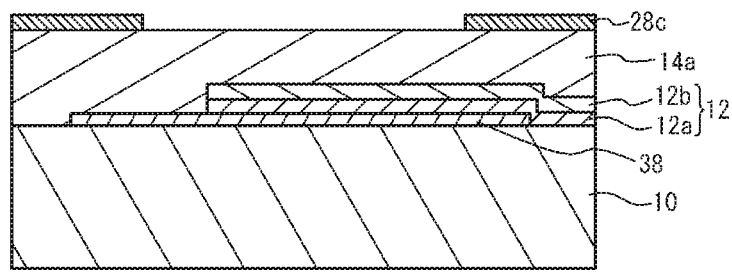

As illustrated in FIG. 17B, the lower piezoelectric film 14a is formed on the lower electrode 12 and the substrate 10 by, for example, sputtering, vacuum evaporation, or CVD. As illustrated in FIG. 17C, the insertion film 28c is formed on the lower piezoelectric film 14a by, for example, sputtering, vacuum evaporation, or CVD. As illustrated in FIG. 17D, the insertion film 28c is patterned into a desired shape by photolithography and etching. The insertion film 28c may be formed by liftoff.

Figure 18A:
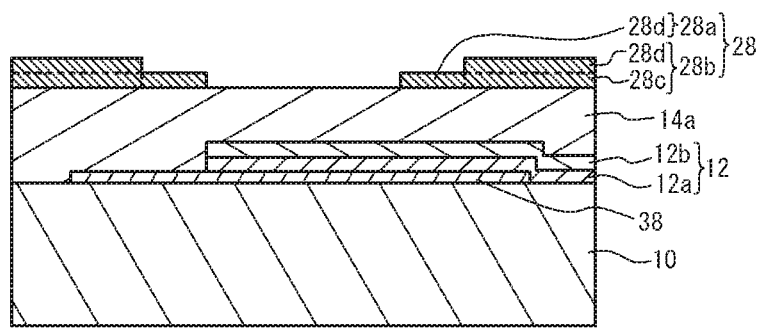
FIG. 18A through FIG. 18C are cross-sectional views (No. 2) illustrating the method of fabricating the series resonator of the first example.

As illustrated in FIG. 18A, the insertion film 28d is formed on the lower piezoelectric film 14a and the insertion film 28c by, for example, sputtering, vacuum evaporation, or CVD. The insertion film 28d is patterned into a desired shape by photolithography and etching. The insertion film 28d may be formed by liftoff. Through this process, the insertion film 28d forms the thin insertion film 28a, and the insertion films 28c and 28d form the thick insertion film 28b. The insertion films 28a and 28b form the insertion film 28.

Figure 18B:
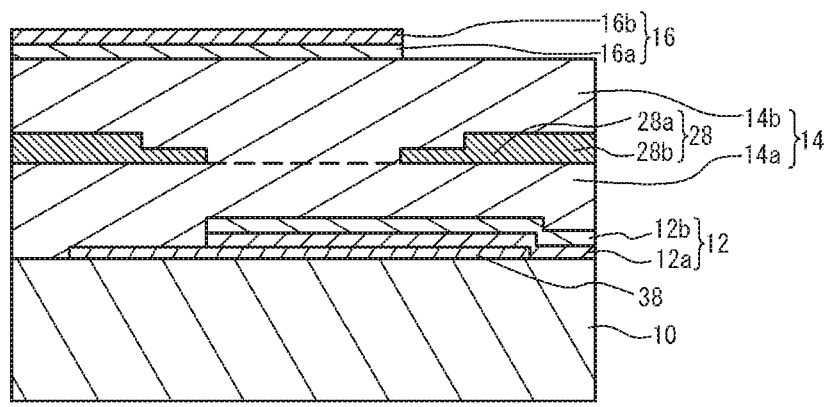

As illustrated in FIG. 18B, the upper piezoelectric film 14b, and the lower layer 16a and the upper layer 16b of the upper electrode 16 are formed on the lower piezoelectric film 14a and the insertion film 28 by, for example, sputtering, vacuum evaporation, or CVD. The lower piezoelectric film 14a and the upper piezoelectric film 14b form the piezoelectric film 14. The upper electrode 16 is patterned into a desired shape by photolithography and etching. The upper electrode 16 may be formed by liftoff.

In the parallel resonator illustrated in FIG. 15C, after the lower layer 16a of the upper electrode 16 is formed, the mass load film 20 is formed by, for example, sputtering, vacuum evaporation, or CVD. The mass load film 20 is patterned into a desired shape by photolithography and etching technique. Thereafter, the upper layer 16b of the upper electrode 16 is formed.

Figure 18C:
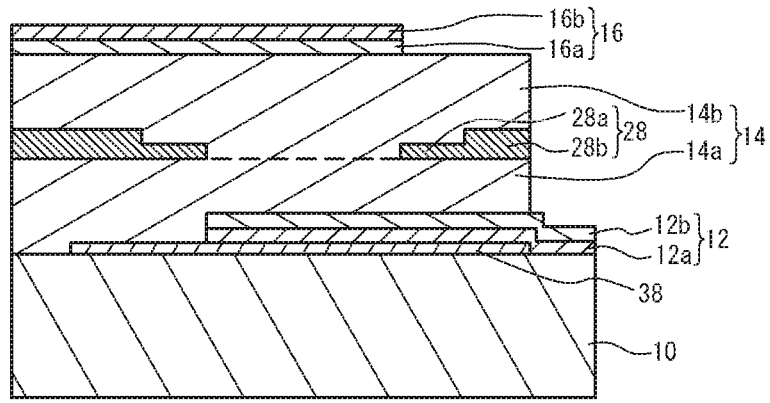

As illustrated in FIG. 18C, the piezoelectric film 14 is patterned into a desired shape by photolithography and etching. The etching may be wet etching or dry etching.

An etching liquid for the sacrifice layer 38 is introduced into the sacrifice layer 38 under the lower electrode 12 through the holes 35 and the introduction path 33 (see FIG. 15A). This process removes the sacrifice layer 38. The substance for etching the sacrifice layer 38 is preferably a substance that does not etch materials constituting the resonator except the sacrifice layer 38. Especially, the substance for etching is preferably a substance that does not etch the lower electrode 12 with which the substance for etching comes in contact. The stress of the multilayered film from the lower electrode 12 to the frequency adjusting film is set to a compression stress. This setting causes the multilayered film to bulge out so as to separate from the substrate 10 to the opposite side from the substrate 10 when the sacrifice layer 38 is removed. Accordingly, the air gap 30 having a dome-shaped bulge is formed between the lower electrode 12 and the substrate 10. The above process completes the series resonator S illustrated in FIG. 15A and FIG. 15B and the parallel resonator P illustrated in FIG. 15A and FIG. 15C.

Figure 19A:
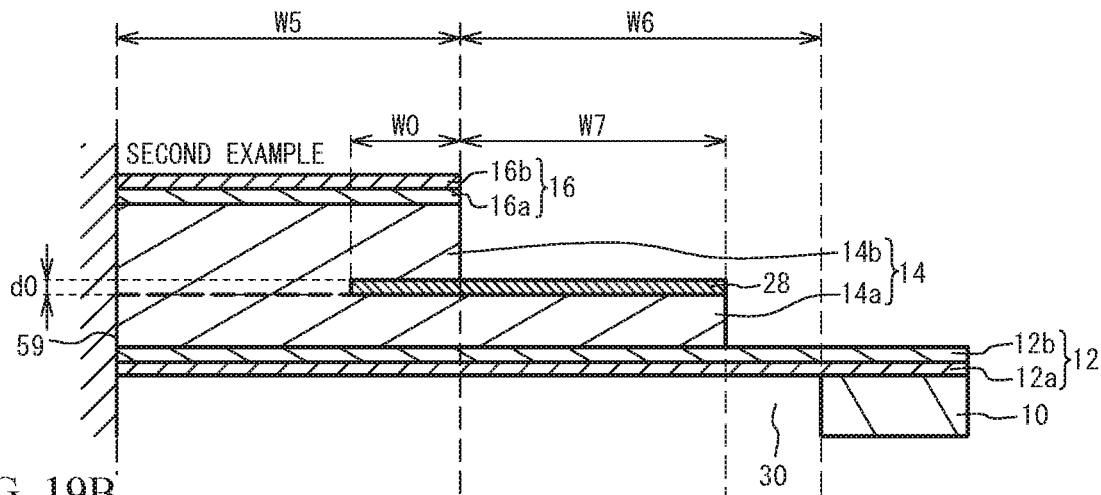
FIG. 19A through FIG. 19C respectively illustrate cross-section structures of a second example, a third example, and the first example that were simulated.
Figure 19B:
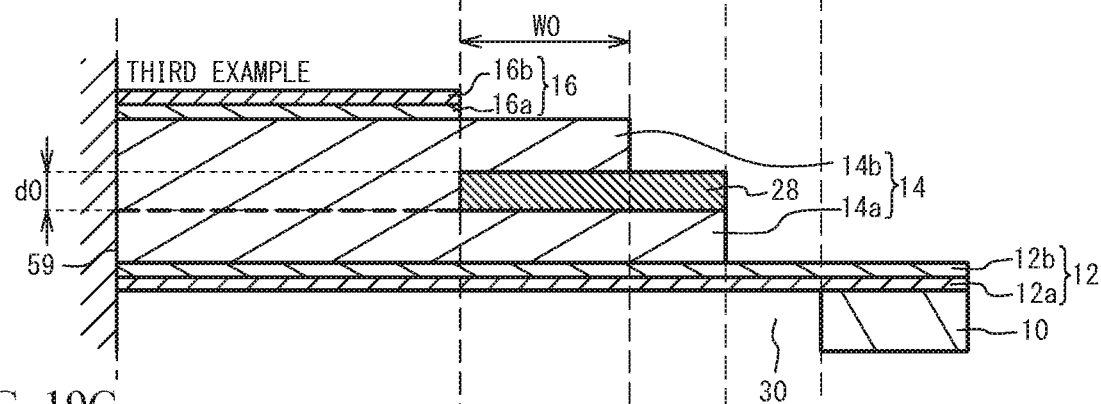
Figure 19C:
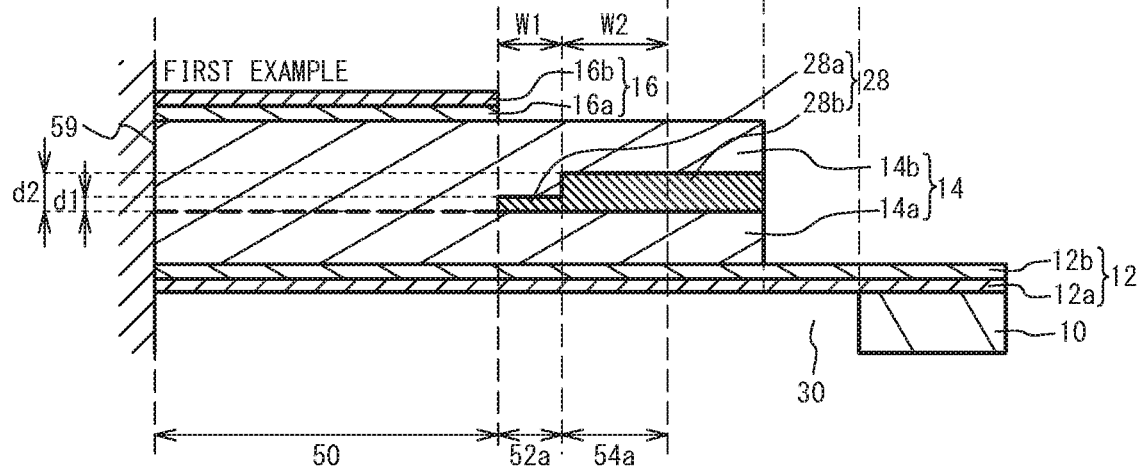

The Q-value and the spurious of the piezoelectric thin film resonator of the first example were simulated with a two-dimensional finite element method. FIG. 19A through FIG. 19C illustrate cross-section structures of a second example, a third example, and the first example, respectively. As illustrated in FIG. 19A through FIG. 19C, the center of the resonance region 50 was assumed to be the mirror boundary face 59. The half of the width of the resonance region 50 was assumed to be W5, the width of the air gap 30 outside the resonance region 50 was assumed to be W6, and the width of the lower piezoelectric film 14a outside the resonance region 50 was assumed to be W7.

As illustrated in FIG. 19A, in the second example, in the outer peripheral region of the resonance region 50, the insertion film 28 is inserted in the piezoelectric film 14. The width and the film thickness of the insertion film 28 in the resonance region 50 were respectively assumed to be W0 and d0. As illustrated in FIG. 19B, in the third example, the insertion film 28 is inserted in the piezoelectric film 14 located further out than the resonance region 50. The width along which the insertion film 28 is inserted in the piezoelectric film 14 was assumed to be W0, and the film thickness of the insertion film 28 was assumed to be d0. As illustrated in FIG. 19C, in the first example, the width of the region 52a was assumed to be W1, and the film thickness of the insertion film 28a was assumed to be d1. The width of the region 54a was assumed to be W2, and the film thickness of the insertion film 28b was assumed to be d2.

Each material and each film thickness used for the simulation are as follows.

Lower layer 12a of the lower electrode 12: Cr film with a film thickness of 100 nm
Upper layer 12b of the lower electrode 12: Ru film with a film thickness of 200 nm
Piezoelectric film 14: AlN film with a film thickness of 1260 nm
Lower piezoelectric film 14a: AlN film with a film thickness of 630 nm
Upper piezoelectric film 14b: AlN film with a film thickness of 630 nm
Insertion film 28: Silicon oxide film
Upper electrode 16: Ru film with a film thickness of 230 nm
Width W5 of the resonance region 50: 42 μm
Width W6 of the air gap 30 located further out than the resonance region 50: 13 μm
Width W7 of the lower piezoelectric film 14a located further out than the resonance region 50: 8 μm Second Example Film thickness d0 of the insertion film 28: 150 nm
Insertion width W0 of the insertion film 28: 2200 nm Third Example Film thickness d0 of the insertion film 28: 300 nm
Insertion width W0 of the insertion film 28: 2800 nm First Example Sample of d1=200 nm
 Film thickness d1 of the insertion film 28a: 200 nm
 Insertion width W1 of the insertion film 28a: 3400 nm
 Film thickness d2 of the insertion film 28b: 300 nm
 Insertion width W2 of the insertion film 28b: 4000 nm
Sample of d1=205 nm
 Film thickness d1 of the insertion film 28a: 205 nm
 Insertion width W1 of the insertion film 28a: 3400 nm
 Film thickness d2 of the insertion film 28b: 300 nm
 Insertion width W2 of the insertion film 28b: 3800 nm
Sample of d1=210 nm
 Film thickness d1 of the insertion film 28a: 210 nm
 Insertion width W1 of the insertion film 28a: 4400 nm
 Film thickness d2 of the insertion film 28b: 300 nm
 Insertion width W2 of the insertion film 28b: 2800 nm FIG. 20 presents a Q-value at the antiresonant frequency and an electromechanical coupling coefficient in the second example, the third example, and the first example. As illustrated in FIG. 20, among the second example, the third example, and the first example, the Q-value at the antiresonant frequency is approximately the same, and the electromechanical coupling coefficient $k^2$ is approximately the same. More in detail, the electromechanical coupling coefficient of the third example is a little less.

Figure 21:
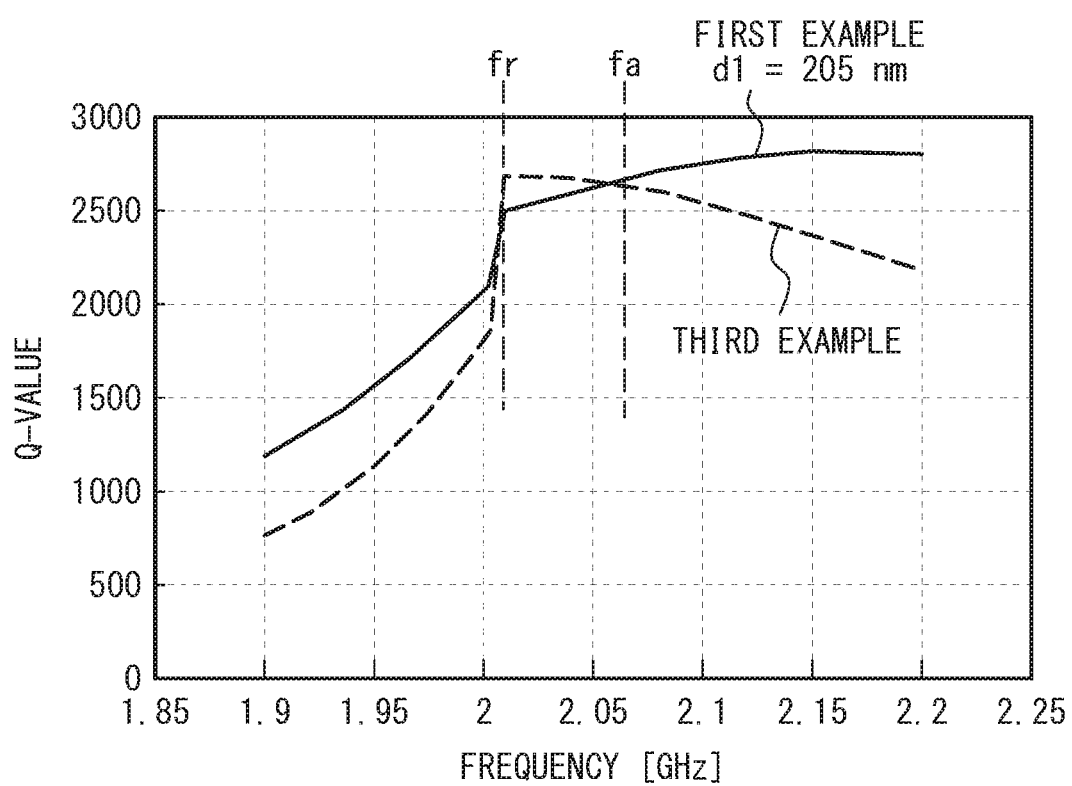
FIG. 21 is a graph of a Q-value versus frequency in the third example and the first example.

FIG. 21 is a graph of a Q-value versus frequency in the third example and the first example. As illustrated in FIG. 21, in the third example, the Q-value is the greatest at the resonant frequency fr, and the Q-value decreases as the frequency increases from the resonant frequency fr. When d1=205 nm in the first example, the Q-value increases as the frequency increases from the resonant frequency fr. At a frequency around 2.15 GHz, the Q-value reaches a maximum. At the antiresonant frequency fa, the Q-value is approximately the same between the third example and the first example, but the maximum value of the Q-value of the first example is greater than that of the third example. The first example has a larger range in which the Q-value is large than the third example.

Figure 22A:
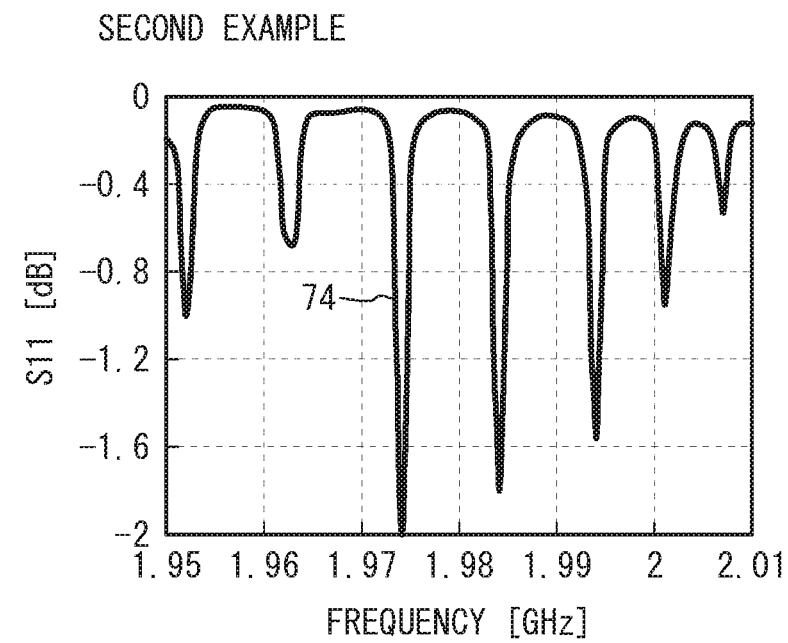
FIG. 22A and FIG. 22B are graphs of a reflection coefficient S11 versus frequency in the second and third examples.
Figure 22B:
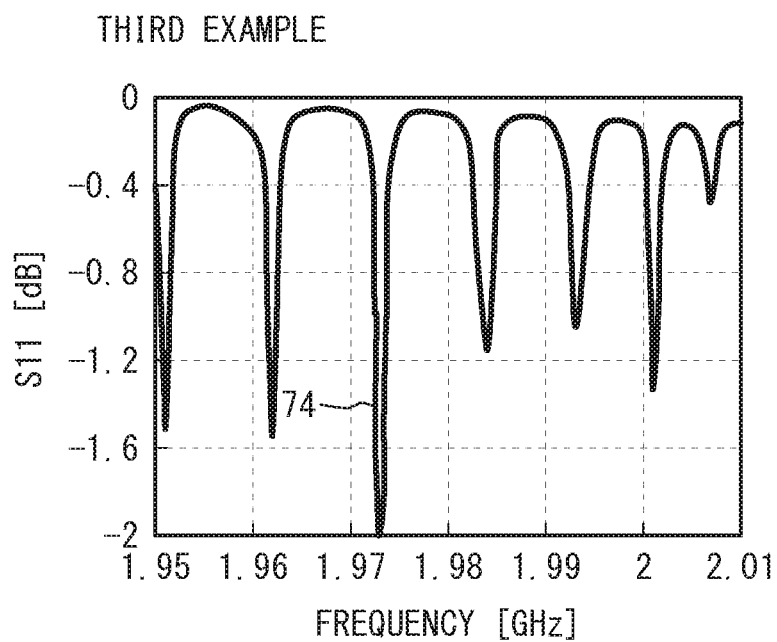

FIG. 22A and FIG. 22B are graphs of the reflection coefficient S11 versus frequency in the second example and the third example, respectively. As illustrated in FIG. 22A and FIG. 22B, in the second example and the third example, a large spurious 74 is observed.

Figure 23A:
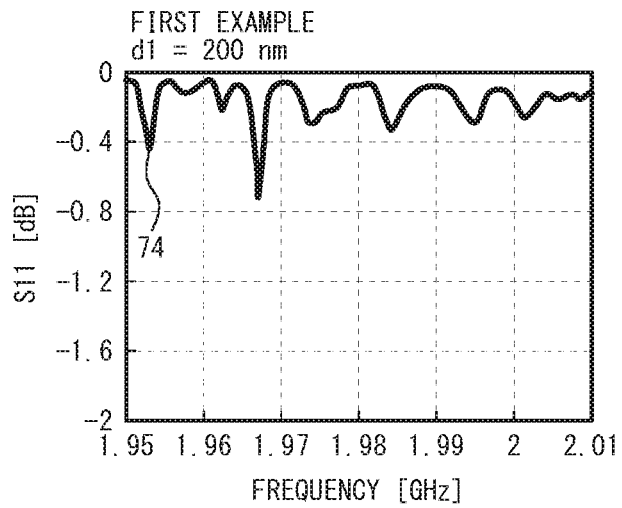
FIG. 23A through FIG. 23C are graphs of the reflection coefficient S11 versus frequency when d1=200 nm, 205 nm, and 210 nm in the first example, respectively.
Figure 23B:
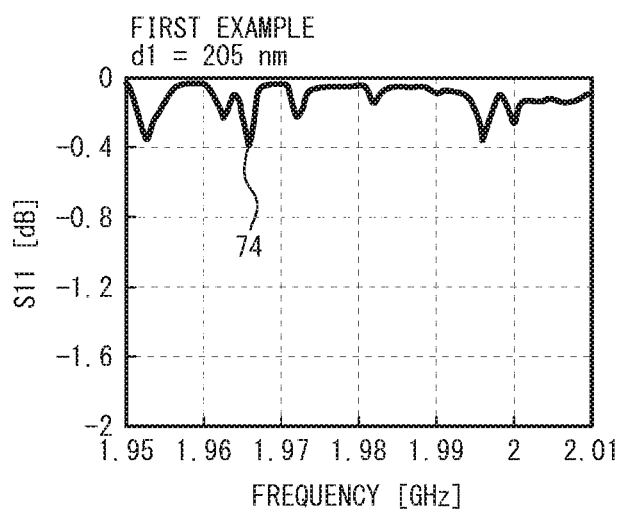
Figure 23C:
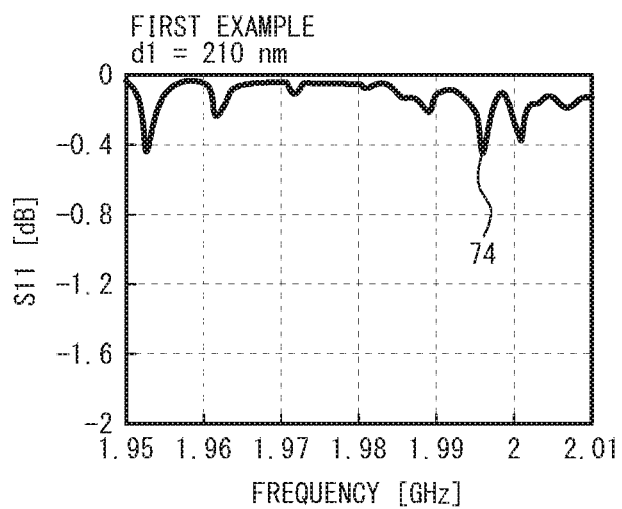

FIG. 23A through FIG. 23C are graphs of the reflection coefficient S11 versus frequency when d1=200 nm, 205 nm, and 210 nm in the first example, respectively. As illustrated in FIG. 23A through FIG. 23C, the spurious is very small compared to the second example and the third example.

In the second and third examples, the acoustic wave in the lateral mode is reflected by the inner outline of the insertion film 28 by providing the insertion film 28. Thus, the leak of the acoustic wave in the lateral mode to the outside of the resonance region 50 (i.e., the leak of the acoustic wave energy to the outside of the resonance region 50) is reduced.

However, as illustrated in FIG. 21A and FIG. 21B, spurious due to the acoustic wave in the lateral mode occurs.

In the first example, the Q-value and the electromechanical coupling coefficient $k^2$ can be made to be approximately equal to or greater than those of the second example and the third example, and spurious is reduced as illustrated in FIG. 22A and FIG. 22B.

The reason why the first example can improve the Q-value and reduce spurious will be described. The dispersion characteristic of the acoustic wave in the lateral mode (the acoustic wave propagating in the lateral direction) in the first example was simulated. The simulation conditions are the same as the above conditions. The simulated mode of the acoustic wave is a primary mode used in the piezoelectric thin film resonator.

Figure 24:
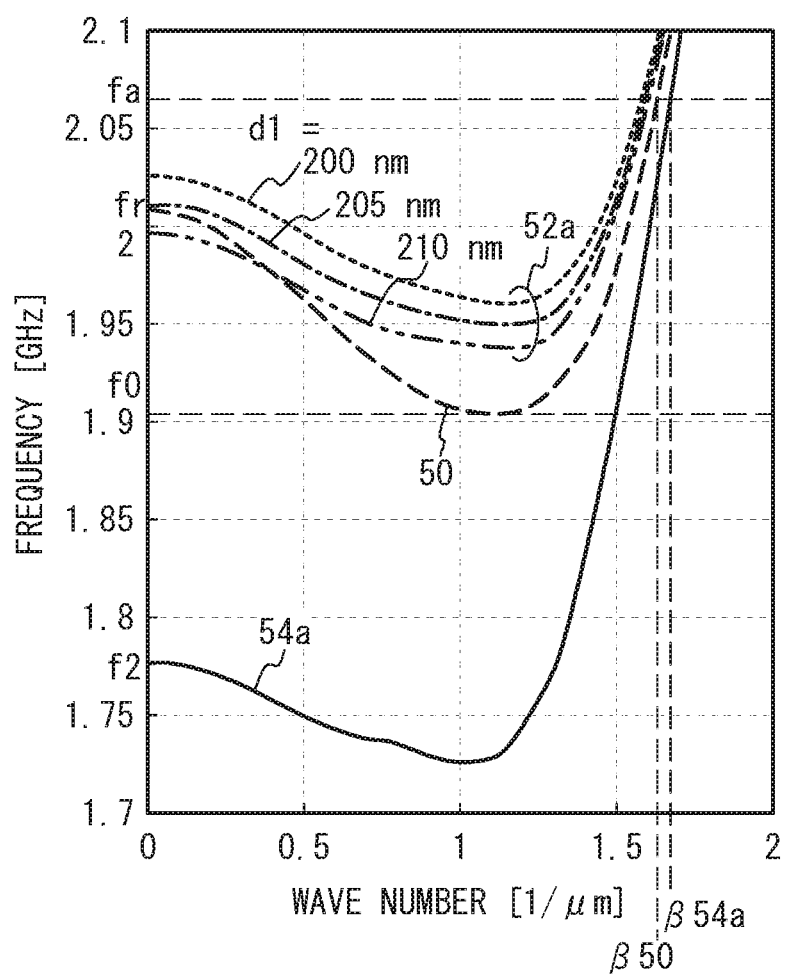
FIG. 24 illustrates the dispersion characteristic of the lateral mode in the first example.

FIG. 24 illustrates the dispersion characteristic of the lateral mode in the first example. In FIG. 24, the horizontal axis represents the wave number in the lateral direction, and the vertical axis represents frequency. When the wave number is 0, the acoustic wave does not propagate in the lateral direction, and the response in the thickness extension mode occurs. When the wave number is greater than 0, the acoustic wave propagates in the lateral direction, and becomes the acoustic wave in the lateral mode. The frequency at which the wave number of the dispersion characteristic in the resonance region 50 is 0 corresponds to the resonant frequency fr of the piezoelectric thin film resonator. In the resonance region 50, the frequency decreases as the wave number increases from 0. After the frequency reaches f0, the frequency increases as the wave number increases. Spurious easily occurs in the frequency band between the frequencies f0 and fr.

The wave number in the resonance region 50 at the antiresonant frequency fa is represented by β50, and the wave number in the region 54a at the antiresonant frequency fa is represented by β54a. The wave number β54a is greater than β50. This indicates that the acoustic wave in the lateral mode in the region 54a is slower than the acoustic wave in the lateral mode in the resonance region 50. Accordingly, the acoustic wave in the lateral mode propagating through the resonance region 50 is reflected by the region 54a. Thus, the leak of the acoustic wave in the lateral mode from the resonance region 50 is reduced. Therefore, the Q-value is improved.

Figure 25A:
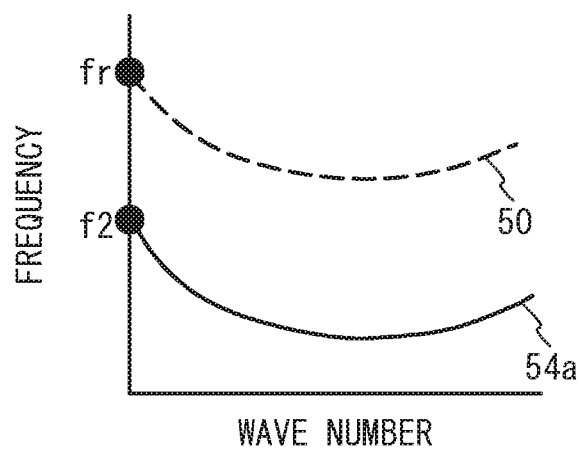
FIG. 25A and FIG. 25B illustrate the dispersion characteristics in the resonance region and the region in which the insertion film is inserted.
Figure 25B:
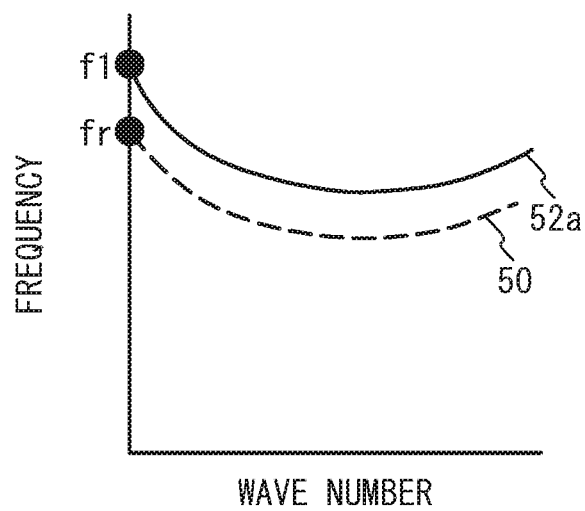

Next, the reason why the first example reduces spurious will be described. FIG. 25A and FIG. 25B illustrate dispersion characteristics of the resonance region and the region in which the insertion film is inserted. As illustrated in FIG. 25A, in the region 54a where the thick insertion film is inserted in the piezoelectric film 14, the cutoff frequency f2 is smaller than the resonant frequency fr. As illustrated in FIG. 25B, in the region 52a where the thin insertion film is inserted in the piezoelectric film 14, the cutoff frequency f1 is located around the resonant frequency fr.

Figure 26A:
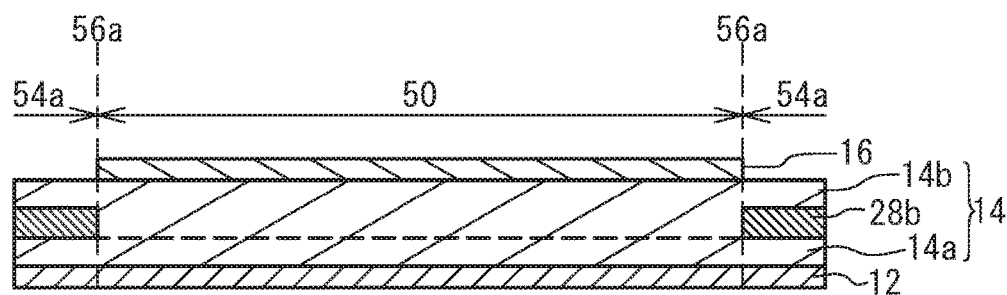
FIG. 26A is a cross-sectional view illustrating a case where a region 54a is in contact with a resonance region 50, and FIG. 26B through FIG. 26E respectively illustrate electrical signals of first through fourth mode standing waves of the lateral mode acoustic wave.
Figure 26A:
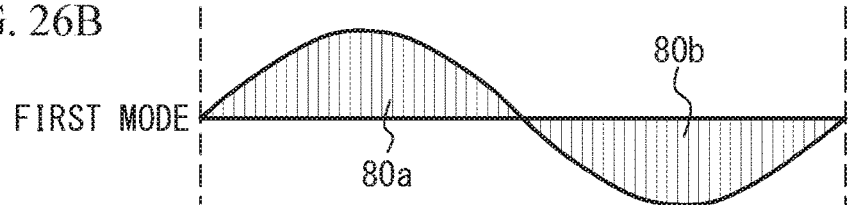
Figure 26A:
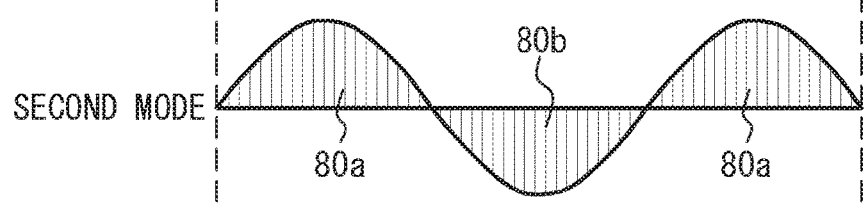
Figure 26A:
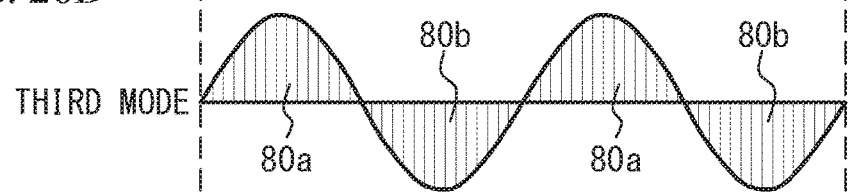
Figure 26A:
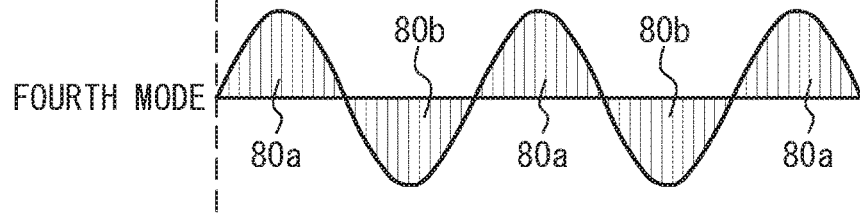

FIG. 26A is a cross-sectional view illustrating a case where the region 54a is in contact with the resonance region 50, and FIG. 26B through FIG. 26E respectively illustrate electrical signals of first through fourth mode standing waves of the lateral mode acoustic wave. As illustrated in FIG. 26A, the regions 54a are located at both sides of the resonance region 50 and are in contact with the resonance region 50. This structure corresponds to the third example. In this structure, as illustrated in FIG. 25A, the cutoff frequency f2 in the region 54a is less than the resonant frequency fr. Thus, the lateral mode acoustic wave with a frequency lower than the resonant frequency fr is unable to propagate through the region 54a. Accordingly, a boundary 56a between the resonance region 50 and the region 54a becomes a fixed end.

As illustrated in FIG. 26B through FIG. 26E, the boundary 56a becomes the node of the standing wave. In the first mode and the third mode, the sum of areas 80a of the positive electrical signal of the standing wave in the resonance region 50 is equal to the sum of areas 80b of the negative electrical signal of the standing wave. Thus, no spurious occurs. In the second mode and the fourth mode, the sum of the areas 80a of the positive electrical signal of the standing wave in the resonance region 50 differs from the sum of the areas 80b of the negative electrical signal of the standing wave. Thus, spurious occurs.

Figure 27A:
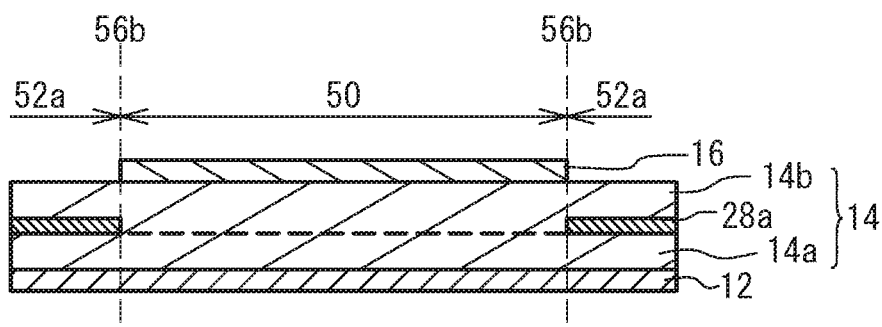
FIG. 27A is a cross-sectional view illustrating a case where a region 52a is in contact with the resonance region 50, and FIG. 27B through FIG. 27E respectively illustrate electrical signals of the first through fourth mode standing waves of the lateral mode acoustic wave.
Figure 27A:
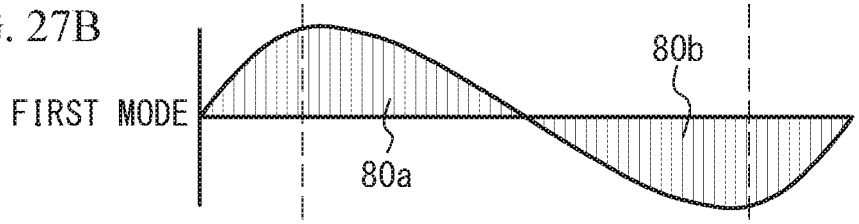
Figure 27A:
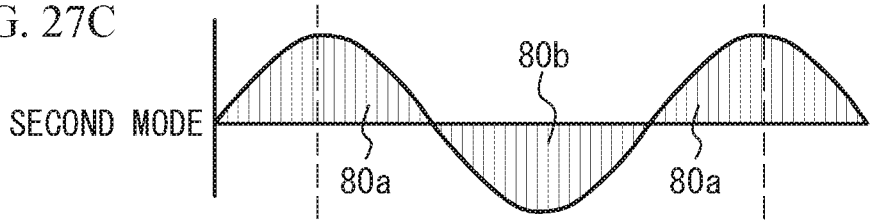
Figure 27A:
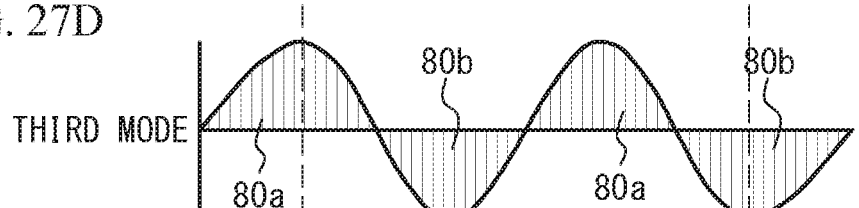
Figure 27A:
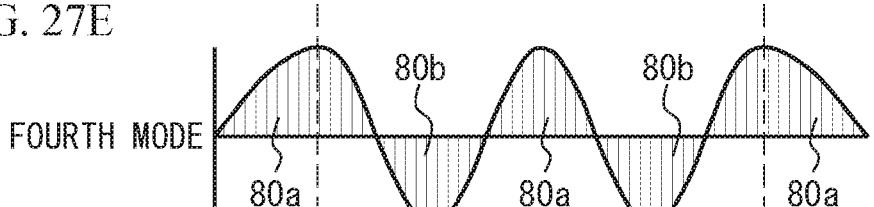

FIG. 27A is a cross-sectional view illustrating a case where the region 52a is in contact with the resonance region 50, and FIG. 27B through FIG. 27E respectively illustrate electrical signals of the first through fourth mode standing waves of the lateral mode acoustic wave. As illustrated in FIG. 27A, the regions 52a are located at both sides of the resonance region 50, and are in contact with the resonance region 50. This structure corresponds to the resonance region 50 and the region 52a of the first example. In this structure, as illustrated in FIG. 25B, the cutoff frequency f1 in the region 52a is located around the resonant frequency fr. Thus, the lateral mode acoustic wave with a frequency lower than the resonant frequency fr can propagate through the region 52a. Accordingly, a boundary 56b between the resonance region 50 and the region 52a becomes a free end.

As illustrated in FIG. 27B through FIG. 27E, the boundary 56b becomes the antinode of the standing wave, and the outer edge of the region 52a becomes the node of the standing wave. In any of the first mode through the fourth mode, the sum of the areas 80a of positive electrical signals of the standing wave in the resonance region 50 is equal to the sum of the areas 80b of negative electrical signals. Therefore, no spurious occurs.

In the third example, as illustrated in FIG. 24, the wave number β54a around the antiresonant frequency fa in the region 54a is made to be greater than the wave number β50 around the antiresonant frequency fa in the resonance region 50. This configuration inhibits the lateral mode acoustic wave around the antiresonant frequency fa from leaking to the outside of the resonance region 50. Thus, the Q-value is improved. However, the cutoff frequency f2 at which the wave number in the region 54a is 0 becomes smaller than the resonant frequency fr. This makes the boundary 56a between the resonance region 50 and the region 54a a fixed end, and thus spurious occurs.

The first example provides the region 54a outside the region 52a, and thereby reduces the leak of the lateral mode acoustic wave around the antiresonant frequency fa to the outside of the resonance region 50. Thus, the Q-value is improved. In addition, since the cutoff frequency f1 in the region 52a is located around the resonant frequency fr, the boundary 56b between the resonance region 50 and the region 52a becomes a free end. Thus, no spurious occurs. As described above, the improvement of the Q-value and the reduction of spurious are achieved.

In the first example, the insertion film 28 is located further out than the resonance region 50 in at least a part of the region surrounding the resonance region 50, and is not located within the resonance region 50. The film thickness d1 (a first film thickness) of the region 52a (a first region) located further out than the resonance region 50 is less than the film thickness d2 (a second film thickness) in the region 54a (a second region) located further out than the region 52a. This structure improves the Q-value and reduces spurious.

In plan view, the resonance region 50, the region 52a, and at least a part of the region 54a overlap with the air gap 30. This structure allows the acoustic wave in the lateral mode to propagate through the piezoelectric film 14 within the resonance region 50, the region 52a, and the at least a part of the region 54a. Thus, the boundary face between the resonance region 50 and the region 52a becomes a free end. Thus, as illustrated in FIG. 23A through FIG. 23C, spurious can be reduced.

As illustrated in FIG. 24, the wave number β54a of the lateral mode in the region 54a at the antiresonant frequency fa in the resonance region 50 is greater than the wave number β50 of the lateral mode in the resonance region 50 at the antiresonant frequency fa. Accordingly, the leak of the acoustic wave in the lateral mode to the outside of the resonance region 50 is reduced. Thus, the Q-value is further reduced.

In addition, the frequency f1 at which the wave number of the lateral mode in the region 52a is 0 is higher than the frequency f2 at which the wave number of the lateral mode in the region 54a is 0. This makes the boundary face between the resonance region 50 and the region 52a a free end, and thereby reduces spurious.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film located on the substrate;
   a lower electrode and an upper electrode facing each other across at least a part of the piezoelectric film; and
   an insertion film that is inserted between the lower electrode and the upper electrode, is located in an outer peripheral region within a resonance region defined by a region where the lower electrode and the upper electrode face each other across the piezoelectric film, is located in a region that is located outside the resonance region and surrounds the resonance region, is not located in a center region of the resonance region, and includes a first part, which is located in the resonance region and along an outer circumference of the resonance region and has a first film thickness, and a second part, which is located outside the resonance region and along the outer circumference of the resonance region, is not located in the resonance region and has a second film thickness, the first film thickness being less than the second film thickness, the second part of the insertion film is not located in a region where both of the lower electrode and the upper electrode are located.

2. The piezoelectric thin film resonator according to claim 1, further comprising:
   an acoustic reflection layer that is located in or on the substrate, and includes an air gap or an acoustic mirror in which at least two layers with different acoustic characteristics are stacked,
   wherein the acoustic reflection layer is located in the resonance region and at least a part of the second part of the insertion film.

3. The piezoelectric thin film resonator according to claim 1, wherein:
   a wave number of a lateral mode in the center region at an antiresonant frequency in the resonance region is less than a wave number of a lateral mode in a region where the first part of the insertion film is located, and
   at the antiresonant frequency in the resonance region, a wave number of a lateral mode in a region where the second part of the insertion film is located is less than the wave number of the lateral mode in the region where the first part of the insertion film is located.

4. The piezoelectric thin film resonator according to claim 1, wherein:
   the piezoelectric film includes a lower piezoelectric film and an upper piezoelectric film located on the lower piezoelectric film, and
   the insertion film is inserted between the lower piezoelectric film and the upper piezoelectric film.

5. The piezoelectric thin film resonator according to claim 1, wherein the first part of the insertion film is in contact with the second part of the insertion film.

6. The piezoelectric thin film resonator according to claim 1, wherein the first part of the insertion film and the second part of the insertion film are located at different positions in a thickness direction.

7. The piezoelectric thin film resonator according to claim 1, wherein the insertion film has less acoustic impedance than the piezoelectric film.

8. A filter comprising:
   a piezoelectric thin film resonator including:
      a substrate;
      a piezoelectric film located on the substrate;
      a lower electrode and an upper electrode facing each other across at least a part of the piezoelectric film; and
      an insertion film that is inserted between the lower electrode and the upper electrode, is located in an outer peripheral region within a resonance region defined by a region where the lower electrode and the upper electrode face each other across the piezoelectric film, is located in a region that is located outside the resonance region and surrounds the resonance region, is not located in a center region of the resonance region, and includes a first part, which is located in the resonance region and along an outer circumference of the resonance region and has a first film thickness, and a second part, which is located outside the resonance region and along the outer circumference of the resonance region, is not located in the resonance region and has a second film thickness, the first film thickness being less than the second film thickness, the second part of the insertion film is not located in a region where both of the lower electrode and the upper electrode are located.

9. A multiplexer comprising:
   a filter including a piezoelectric thin film resonator, wherein
   the piezoelectric thin film resonator includes:
      a substrate;
      a piezoelectric film located on the substrate;
      a lower electrode and an upper electrode facing each other across at least a part of the piezoelectric film; and
      an insertion film that is inserted between the lower electrode and the upper electrode, is located in an outer peripheral region within a resonance region defined by a region where, the lower electrode and the upper electrode face each other across the piezoelectric film, is located in a region that is located outside the resonance region and surrounds the resonance region, is not located in a center region of the resonance region, and includes a first part, which is located in the resonance region and along an outer circumference of the resonance region and has a first film thickness, and a second part, which is located outside the resonance region and along the outer circumference of the resonance region, is not located in the resonance region and has a second film thickness, the first film thickness being less than the second film thickness, the second part of the insertion film is not located in a region where both of the lower electrode and the upper electrode are located.

\* \* \* \* \*